(12) United States Patent
Lastras-Montano

(10) Patent No.: US 7,949,931 B2
(45) Date of Patent: May 24, 2011

(54) SYSTEMS AND METHODS FOR ERROR DETECTION IN A MEMORY SYSTEM

(75) Inventor: Luis A. Lastras-Montano, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 1178 days.

(21) Appl. No.: 11/619,015

(22) Filed: Jan. 2, 2007

(65) Prior Publication Data

US 2008/0163032 A1   Jul. 3, 2008

(51) Int. Cl.
*H03M 13/00* (2006.01)

(52) U.S. Cl. .................. 714/785; 714/768; 714/801

(58) Field of Classification Search .................. 714/752, 714/758, 785
See application file for complete search history.

(56) References Cited

U.S. PATENT DOCUMENTS

| | | | |
|---|---|---|---|
| 4,077,028 A * | 2/1978 | Lui et al. | 714/777 |
| 5,513,135 A | 4/1996 | Dell et al. | |
| 6,173,382 B1 | 1/2001 | Dell et al. | |
| 6,381,685 B2 | 4/2002 | Dell et al. | |
| 6,510,100 B2 | 1/2003 | Grundon et al. | |
| 6,587,912 B2 | 7/2003 | Leddige et al. | |
| 2003/0163764 A1* | 8/2003 | Williams et al. | 714/25 |
| 2007/0011598 A1* | 1/2007 | Hassner et al. | 714/801 |

* cited by examiner

*Primary Examiner* — Sam Rizk

(74) *Attorney, Agent, or Firm* — Cantor Colburn LLP; Stephen Kaufman

(57) ABSTRACT

A method for error detection in a memory system. The method includes calculating one or more signatures associated with data that contains an error. It is determined if the error is a potential correctable error. If the error is a potential correctable error, then the calculated signatures are compared to one or more signatures in a trapping set. The trapping set includes signatures associated with uncorrectable errors. An uncorrectable error flag is set in response to determining that at least one of the calculated signatures is equal to a signature in the trapping set.

19 Claims, 14 Drawing Sheets

3-WEIGHT                              5-WEIGHT  1-WEIGHT
```

| MEMORY TECHNOLOGY | BURST LENGTH |
|---|---|
| SDRAM | 1, 2, 4, 8 |
| DDR | 2, 4, 8 |
| DDR2 | 4, 8 |
| DDR3 | 8 |
| DDR4 (IN PLANNING) | 8 (PUSH TO 16) |

FIG. 7

… # SYSTEMS AND METHODS FOR ERROR DETECTION IN A MEMORY SYSTEM

BACKGROUND OF THE INVENTION

This invention relates generally to computer systems, and more particularly to improving the error detection in a memory system through the use of syndrome trapping.

Contemporary high performance computing main memory systems are generally composed of one or more dynamic random access memory (DRAM) devices which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), the type and structure of the memory interconnect interface(s) and the type and efficiency of any failure detection/correction function associated with one or more elements of the system.

FIG. 1 relates to U.S. Pat. No. 5,513,135 to Dell et al., of common assignment herewith, and depicts an early synchronous memory module. The memory module depicted in FIG. 1 is a dual in-line memory module (DIMM). This module is composed of synchronous DRAMs 108, buffer devices 112, an optimized pinout, and an interconnect and capacitive decoupling method to facilitate high performance operation. The patent also describes the use of clock re-drive on the module, using such devices as phase-locked loops (PLLs).

FIG. 2 relates to U.S. Pat. No. 6,173,382 to Dell et al., of common assignment herewith, and depicts a computer system 210 which includes a synchronous memory module 220 that is directly (i.e. point-to-point) connected to a memory controller 214 via a bus 240, and which further includes logic circuitry 224 (such as an application specific integrated circuit, or "ASIC") that buffers, registers or otherwise acts on the address, data and control information that is received from the memory controller 214. The memory module 220 can be programmed to operate in a plurality of selectable or programmable modes by way of an independent bus, such as an inter-integrated circuit (I2C) control bus 234, either as part of the memory initialization process or during normal operation. When utilized in applications requiring more than a single memory module connected directly to a memory controller, the patent notes that the resulting stubs can be minimized through the use of field-effect transistor (FET) switches to electrically disconnect modules from the bus.

Relative to U.S. Pat. Nos. 5,513,135, 6,173,382 further demonstrates the capability of integrating all of the defined functions (address, command, data, presence detect, etc) into a single device. The integration of functions is a common industry practice that is enabled by technology improvements and, in this case, enables additional module density and/or functionality.

Extensive research and development efforts are invested by the industry, on an ongoing basis, to create improved and/or innovative solutions to maximize overall system performance, density and reliability by enhancing one or more of the memory controller, overall memory system and/or subsystem design and/or structure. The increasing need for high-availability and minimal (if any) system down-time presents further challenges as related to overall system reliability due to customer expectations that new computer systems will markedly surpass existing systems in regard to mean-time-between-failure (MTBF), in addition to offering additional functions, increased performance, increased storage, lower operating costs, etc.

The use of enhanced error correction techniques has been a major factor in improving MTBF; however the added cost for the memory devices required to store the necessary error code correction (ECC) check bits is excessive for some markets— with this situation being further aggravated by increased minimum memory device burst lengths with emerging memory technologies (e.g., DDR3 and DDR4 SDRAMS). A memory system solution that will ensure a high degree of data integrity, at minimal overhead (e.g., cost, performance, etc.) would be highly desirable for systems such as high-end desktop computers/laptops, low-end servers and other computer and non-computer systems. Other types of systems include, but are not limited to communications, I/O and printer systems.

Reliable storage and/or transmission systems are generally designed so that identification and correction of failures is assured with certainty, or at least with a very high probability. The ECC systems are further designed with the intent that the probability of error mis-correction is extremely small or zero for specific classes of error patterns. For example, a code with minimum distance 4 allows for the simultaneous correction of any one error and the detection of any two errors, whereas a code with a minimum distance 3 allows for single error correction with some mis-correction possible with double failures.

In some instances, the amount of memory bits (e.g. redundancy) that can be invested to protect data to be stored or transmitted is limited. For example, high-end desktops and low-end servers may decide that an ECC code having a minimum distance of 3, which does not allow for the detection for any two errors, is the maximum affordable solution (e.g., the best cost/performance tradeoff). This maximum affordable solution generally results in a measurable data integrity risk due to the inability of the code to reliably detect two or more errors. It would be desirable to decrease the data integrity risk associated with the maximum affordable solution.

BRIEF SUMMARY OF THE INVENTION

An exemplary embodiment includes a method for error detection in a memory system. The method includes calculating one or more signatures associated with data that contains an error. It is determined if the error is a potential correctable error. If the error is a potential correctable error, then the calculated signatures are compared to one or more signatures in a trapping set. The trapping set includes signatures associated with uncorrectable errors. An uncorrectable error flag is set in response to determining that at least one of the calculated signatures is equal to a signature in the trapping set.

A further exemplary embodiment includes a memory system for performing error detection. The memory system includes a single memory module operating in response to memory read requests. Alternatively, the memory system includes two or more memory modules operating in unison in response to the memory read requests. Each memory module includes one or more memory devices. The memory system also includes a processor including logic for facilitating calculating one or more signatures associated with data returned in response to a memory read request that contains an error. It is determined if the error is a potential correctable error. If the error is a potential correctable error, then the calculated signatures are compared to one or more signatures in a trapping set. The trapping set includes signatures associated with uncorrectable errors. An uncorrectable error flag is set in response to determining that at least one of the calculated signatures is equal to a signature in the trapping set.

A further exemplary embodiment includes a system for performing error detection. The system includes error code correction logic and syndrome trapping logic. The error correction logic determines if data contains an error. The syndrome trapping logic performs a method in response to the data containing an error. The method includes calculating one or more signatures for the data. It is determined if the error is a potential correctable error. If the error is a potential correctable error, then the calculated signatures are compared to one or more signatures in a trapping set. The trapping set includes signatures associated with uncorrectable errors. An uncorrectable error flag is set in response to determining that at least one of the calculated signatures is equal to a signature in the trapping set.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES:

FIG. 6 depicts a basic single error correct/double error detect code H-matrix;

FIG. 7 depicts a table of exemplary burst lengths for various memory technologies;

DETAILED DESCRIPTION OF EXEMPLARY EMBODIMENTS

Exemplary embodiments provide techniques for allowing increased error detection rates by exploiting tradeoffs between error correction and detection capacity in a memory system. Exemplary embodiments further offer significant benefits to lower-cost systems produced with emerging SDRAM technologies, such as DDR3 and DDR4, when high levels of data integrity are desired at minimum cost, impact to performance and overhead.

Figure 3:
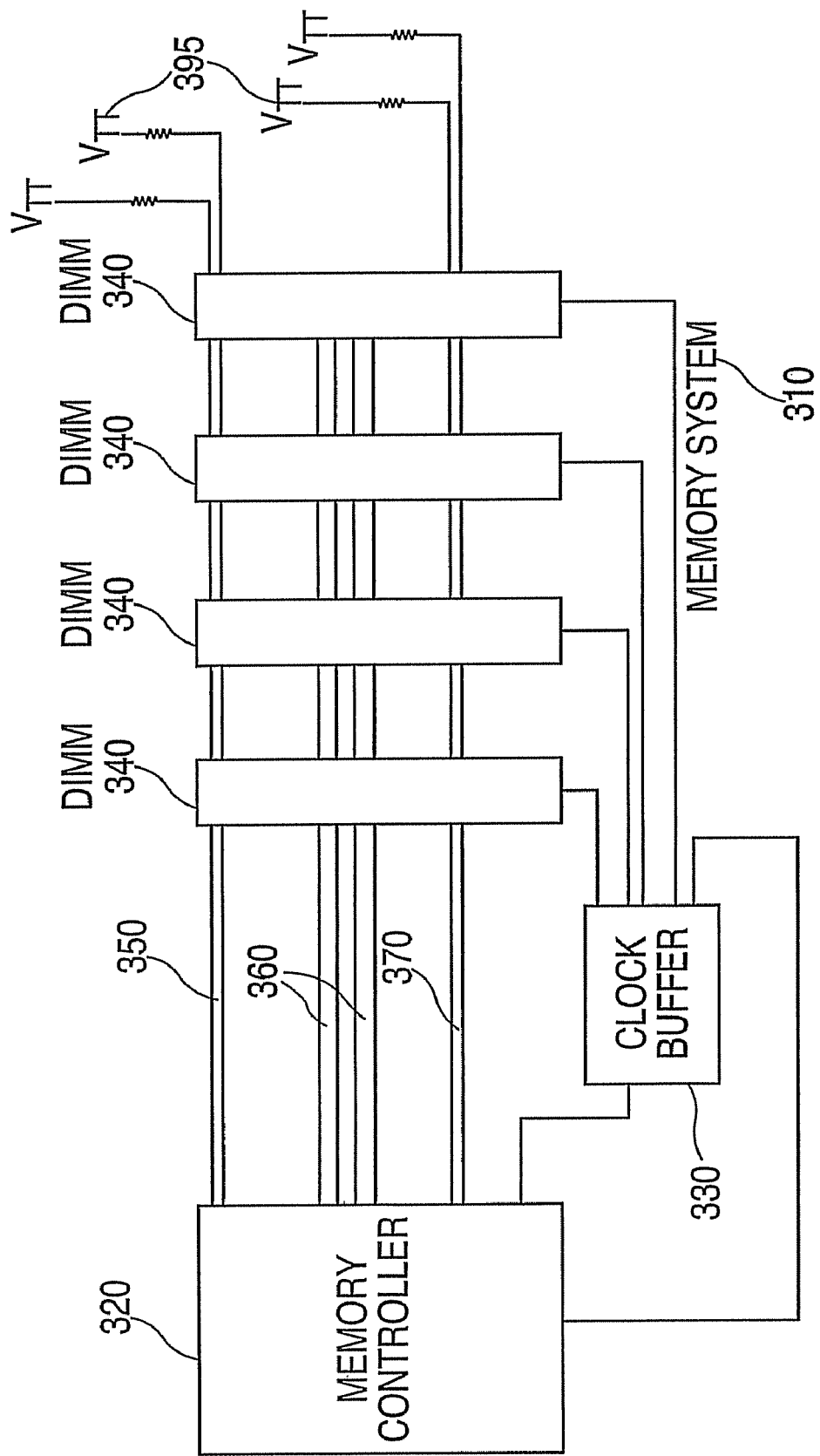
FIG. 3 depicts an exemplary memory system, shown with a single, traditional multi-drop stub bus.
Figure 4:
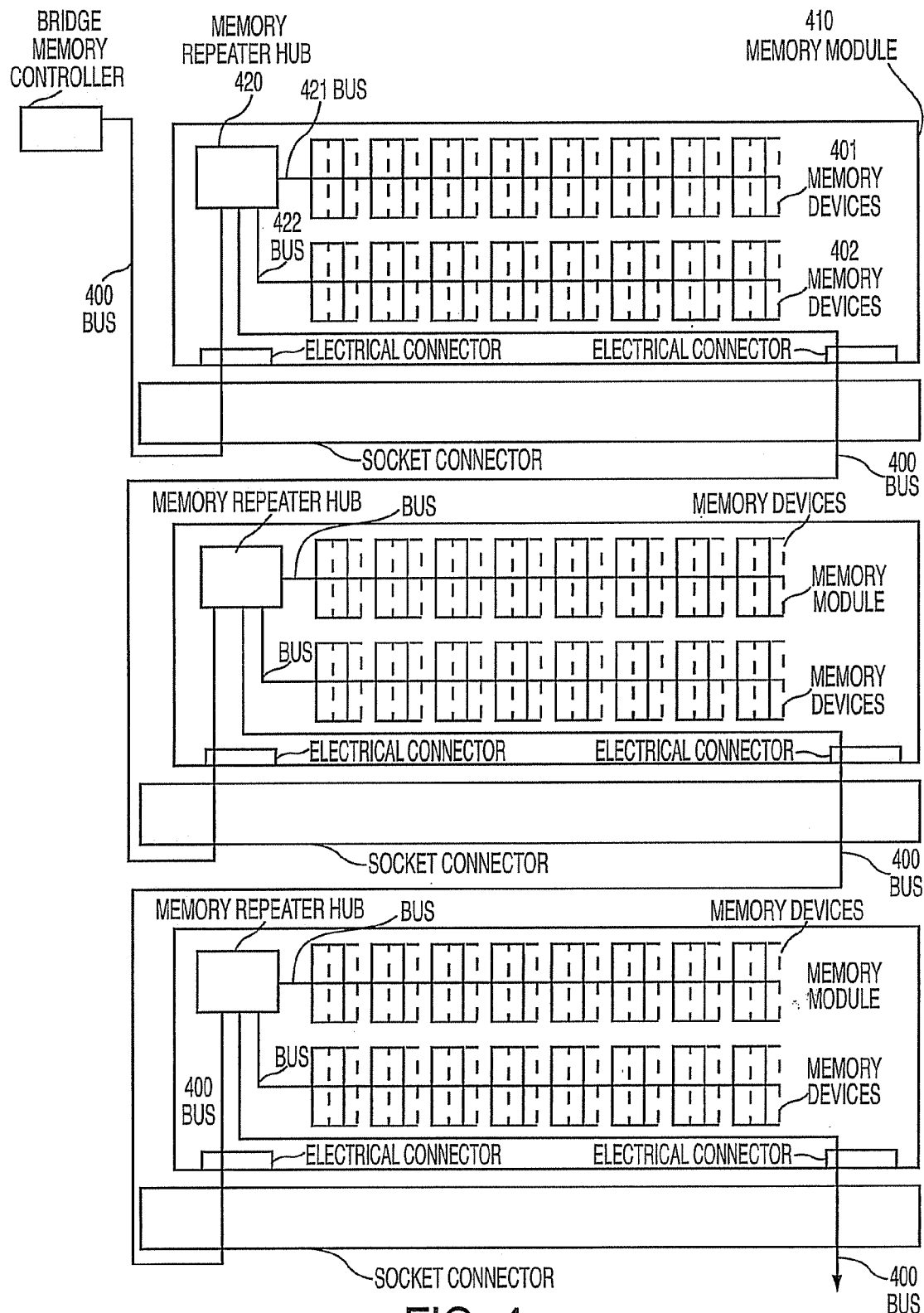
FIG. 4 depicts a fully buffered synchronous memory module and system structure, where the fully buffered synchronous memory module includes a repeater function.
Figure 5:
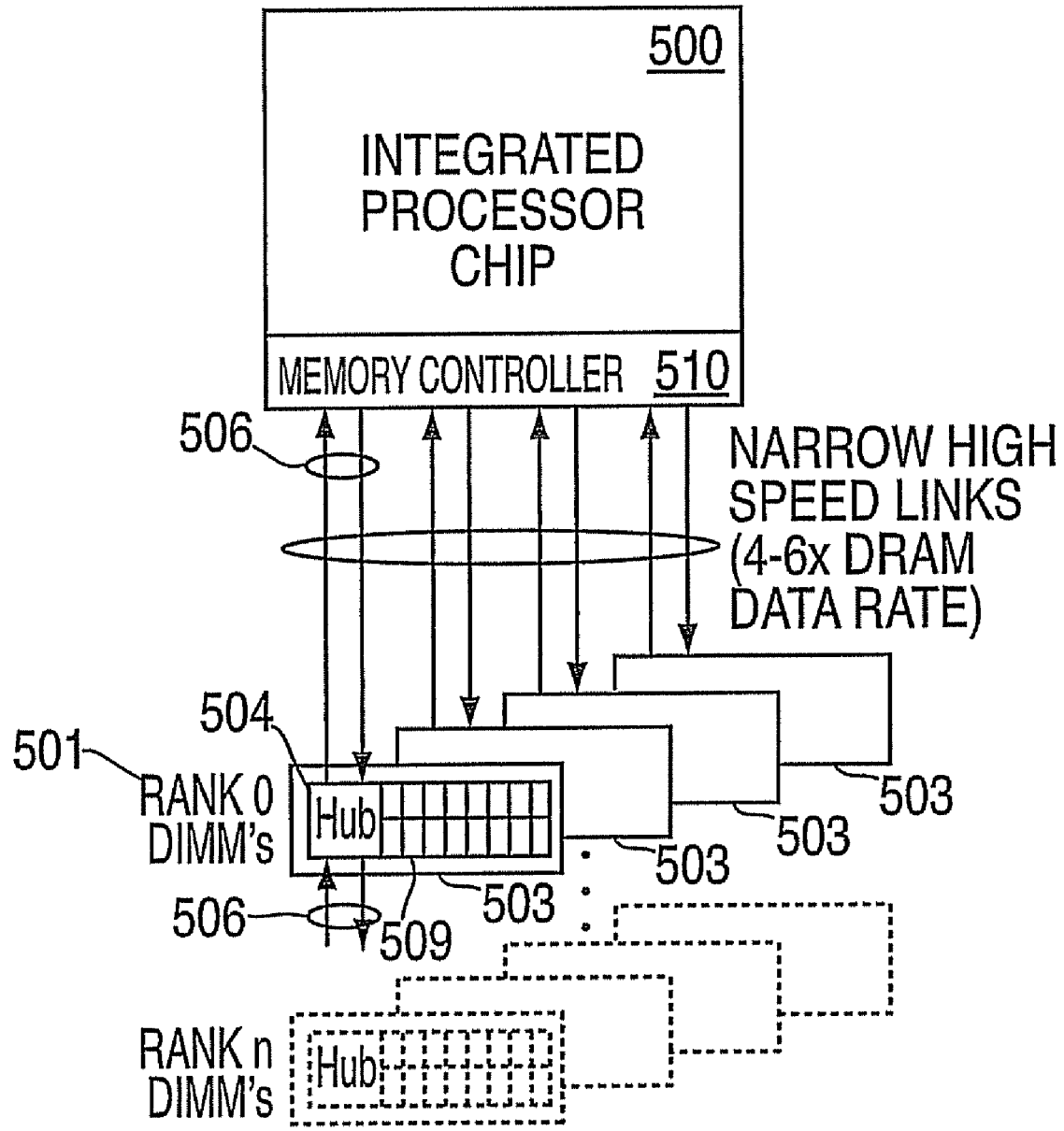
FIG. 5 depicts a block diagram of a computer memory system which includes multiple independent cascade interconnect memory interface busses that operate in unison to support a single data access request.

FIGS. 3-5 that follow are used as a means of describing example conventional memory structures to which exemplary embodiments of the present invention would apply.

FIG. 3, from U.S. Pat. No. 6,510,100 to Grundon et al., of common assignment herewith, depicts a simplified diagram and description of a memory system 310 that includes up to four registered DIMMs 340 on a traditional multi-drop stub bus. The subsystem includes a memory controller 320, an external clock buffer 330, registered DIMMs 340, an address bus 350, a control bus 360 and a data bus 370 with terminators 395 on the address bus 350 and the data bus 370. Although only a single memory channel is shown in FIG. 3, systems produced with these modules often included more than one discrete memory channel from the memory controller, with each of the memory channels operated singly (when a single channel was populated with modules) or in parallel (when two or more channels where populated with modules) to achieve the desired system functionality and/or performance. Using conventional registered DIMMs, a data bus width of 72 bits would be available from each memory channel. Although only one channel is shown, a system would often have 2, 4 or more memory channels of the type shown, resulting in a transfer of 32, 64, 128 or more bytes of data in response to a cache line operation. Further, each memory module 340, would generally include 72 bits of data, permitting the use of ECC to correct most data errors, with the ECC circuitry, or logic, located in the memory controller 320.

FIG. 4, from U.S. Pat. No. 6,587,912 to Bonella et al., depicts an alternate system structure including synchronous memory module 410 and a memory system structure in which the repeater hubs 420 include local re-drive of the address, command and data to the local memory devices 401 and 402 via buses 421 and 422; generation of a local clock (as described in other figures and the patent text); and the re-driving of the appropriate memory interface signals to the next module or component in the system via bus 400.

FIG. 5 depicts a contemporary memory system composed of an integrated processor chip 500, which contains one or more processor elements and an integrated memory controller 510. In the configuration depicted in FIG. 5, multiple independent cascade interconnected memory interface busses 506 are logically aggregated together to operate in unison to support a single independent access request at a higher bandwidth with data and error detection/correction information distributed or "striped" across the parallel busses and associated devices. The memory controller 510 attaches to four narrow/high speed point-to-point memory busses 506, with each bus 506 connecting one of the several unique memory controller interface channels to a cascade interconnect memory subsystem 503 which includes at least a hub device 504 and one or more memory devices 509 (or DRAMs). Using contemporary synchronous memory devices, an access initiated by the memory controller 510 would commonly result in a transfer of 128 bytes of data (8 byte DIMM width×4 DIMMs operating in unison×4 bit burst from each selected DRAM).

Using conventional buffered DIMMs, a data bus width of 72 bits would be available on each DIMM (typically by accessing 9 memory devices 509 that are 8 bits wide, or by accessing 18 memory devices 509 that are 4 bits wide), permitting the use of ECC to identify and correct most data errors. As with FIGS. 3 and 4, the data path ECC circuitry, or logic in FIG. 5, would generally be located in the memory controller 510 and include the check bit generation and subsequent error detection and correction.

As is commonly known in the art, the term "Hamming distance" refers to how powerfully an ECC can detect and/or correct errors. A d=3 code can detect and correct all single errors. A d=4 code can correct all single errors while simultaneously detecting all double errors. A d=5 code can correct all double errors. A d=6 code can correct all double errors while simultaneously detecting all triple errors. The concept is further understood to be applicable to symbol-oriented codes, where a symbol is a predefined group of bits in the code stream. Thus a distance 4 symbol code can correct all single symbol errors while simultaneously detecting all double symbol errors, etc. In general, the terms Single Symbol Correcting (SSC) and Double Symbol Detecting (DSD) would be combined for a distance 4 code and it would be designated, SSC/DSD, and similarly for a distance 4 binary code, the terms Single Error Correcting (SEC) and Double Error Detecting (DED) would be combined and thus the code would be referred to as a SEC/DED code.

FIG. 6 depicts a basic SEC/DED code H-matrix. One of the simplest single error detecting (SED) codes is a parity code. In terms of "exclusive ORs" (XOR's), the parity bit is the XOR or "exclusive not OR" (XNOR) of all of the databits (depending on whether the scheme calls for "even" or "odd" parity). A Hamming code is a single error correcting (SEC) code that is more complex and powerful than a parity code. For example, if a dataword that is parity protected at one point in a computer or communications system is then required to be further encoded to provide SEC/DED protection, a simple code construction exists to allow reuse of the parity code as a nested code within an extended Hamming code. In exemplary embodiments, the construction is to take an existing Hamming code and add an overall parity checkbit to provide a SEC/DED extended Hamming code, which has the parity code nested within it and which has the parity bit reused as one of the Hamming code checkbits. ECCs (e.g., SEC/DED codes) are often described in terms of H-matrices (arrays of ones and zeros that indicate which databits have to be XOR'd together to encode checkbits).

FIG. 7 includes a table describing the available burst lengths for various generations of SDRAM devices, including SDRAMs, DDR SDRAMs, DDR2 SDRAMs, DDR3 SDRAMs and proposed burst length(s) for DDR4 SDRAMs. As is evidenced by the information in the table, the minimum burst length is increasing for every SDRAM generation—with DDR3 SDRAMs (an emerging technology at the time of this invention) offering a minimum burst length of 8 (as compared to a minimum burst length of 1 for initial SDRAMs). With many contemporary and/or emerging systems operating with a cache line of 128 bytes, the increased burst length is becoming problematic in regard to attaining acceptable levels of error detection and correction.

Figure 8:
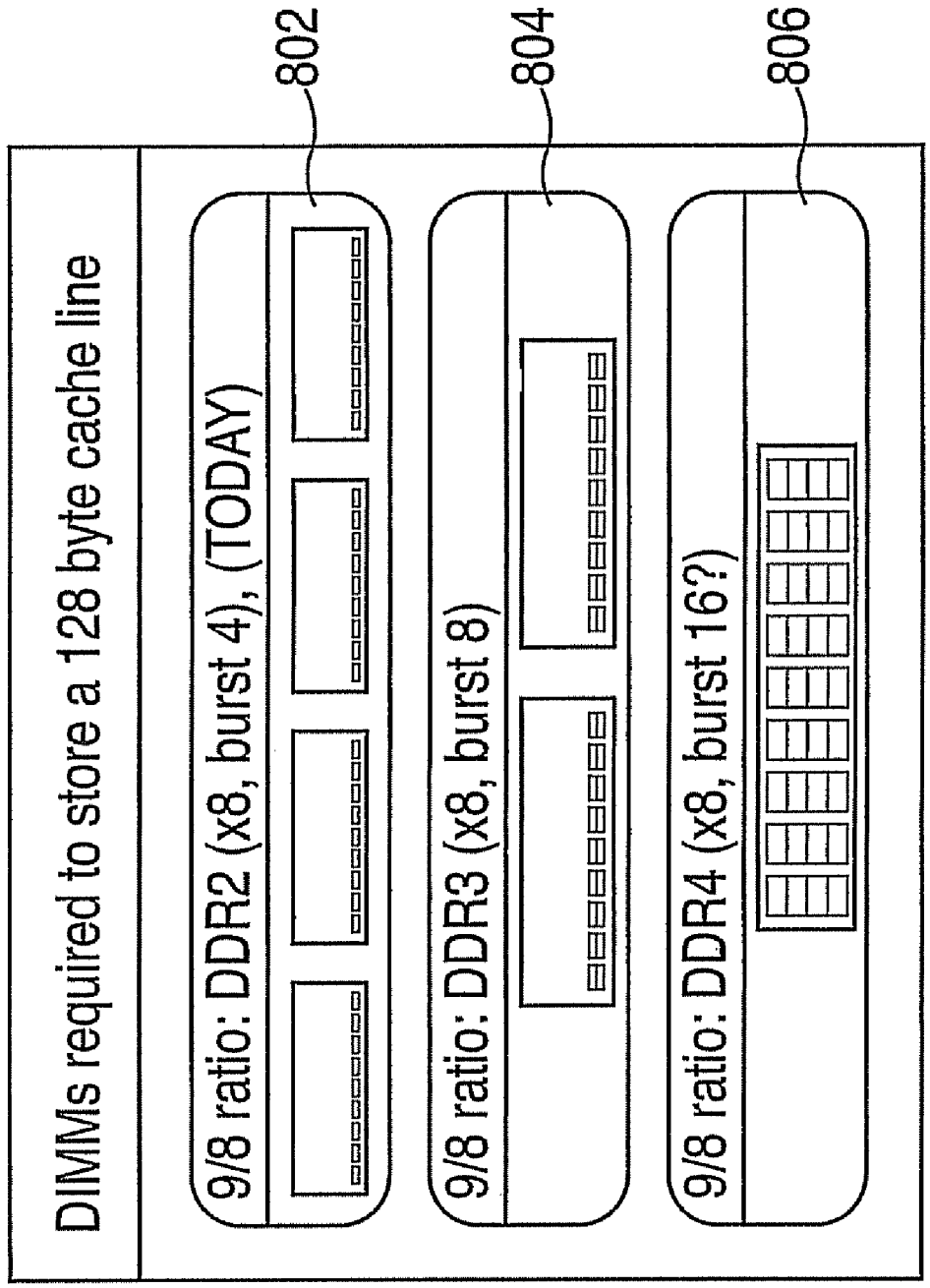
FIG. 8 depicts exemplary configurations of DIMMS that may be utilized to store a 128 byte cache line.

FIG. 8 shows the minimum number of conventional DIMMs, produced with x8 devices and including 72 bits of data width, that would be accessed using DDR2, DDR3 and DDR4 (projected) memory devices, to operate in a 128 byte cache line environment. As evident in the DDR2 configuration 802, 72 bit data width DIMMs, produced using x8 DDR2 memory devices having a minimum burst length of 4, would easily support a 128 byte cache line. With the use of 4 DIMMs operating in unison (e.g., with parallel accesses), 32 bytes of data are accessed for each beat of the burst of 4 accesses (8 data bytes per DIMM×4 DIMMs=32 data bytes per beat), yielding a total access of 128 data bytes+16 additional bytes available for ECC, sparing or other purposes. Depending on the method in which the ECC is applied (e.g., across a single DRAM beat or across multiple DRAM beats), ECC options include at least a distance 3 (single symbol correct) or distance 4 ECC code for contemporary DDR2 SDRAM-based memory systems to provide a SSC/DSD (single symbol correct/double symbol detect) capability, applied on a per-beat basis, in addition to providing a 'spare chip' which can be used by the system to map out defective memory device(s) and/or other failures (wire, solder, connector, etc) which result in the inability to properly access up to a single byte across the 4 DIMMs. Larger minimum distances in a code can also be accommodated by applying the code across multiple DRAM beats.

As is evident in the DDR2 configuration 802 and the DDR3 configuration 804, an increase in the minimum burst length for DDR3 (from 4 to 8) will result in twice the amount of data available for each memory access—unless the data width is reduced by a factor of two. In general, if a 128 byte cache line is retained, the memory system structure will generally be modified such that two, 72 bit DIMMs are accessed in unison (instead of four)—as is shown in the DDR3 configuration 804. In this case, the 128 byte cache line would be constructed over eight DRAM beats (8 bytes per DIMM×2 DIMMs×8 beats=128 bytes of data). With no other changes, the use of the same ECC solution for the DDR3 configuration 804 as utilized for the DDR2 configuration 802 would require more than one access (beat) to the 16 byte (2×72 bit) data width to construct the ECC word, with a corresponding re-use of memory devices, interconnections, etc. This approach would result in a significant reduction in the percentage of errors that are correctable (e.g., a chip kill would affect multiple symbols within the ECC word). Further, the loss of an independent "spare" memory device(s), such as the single spare device (of the 4 redundant memory devices available in the DDR2 configuration 802), would reduce the system survivability in light of memory/memory subsystem errors. The problem is further exacerbated with the proposed DDR4 minimum burst length of 16, as shown in the DDR4 configuration 806, where a 128 byte cache line is constructed using a single 72 bit DIMM, over 16 DRAM beats.

As evidenced in the DDR3 configuration 804, the optimal interface for systems having 128 byte cache lines and including 72 bit wide memory subsystems produced with x8 devices having a minimum burst length of 8, is one in which two memory subsystems (e.g. 8 Byte DIMMs with 72 bits/DIMM) are accessed in unison, while still providing a high degree of fault correction and detection. Exemplary embodiments described herein address the DDR3 configuration 804, or memory structure, however, exemplary embodiments can also be used in other applications (e.g., the DDR4 configuration 806) having a similar need to provide a high degree of fault tolerance using a minimum number of ECC bits.

Figure 9:
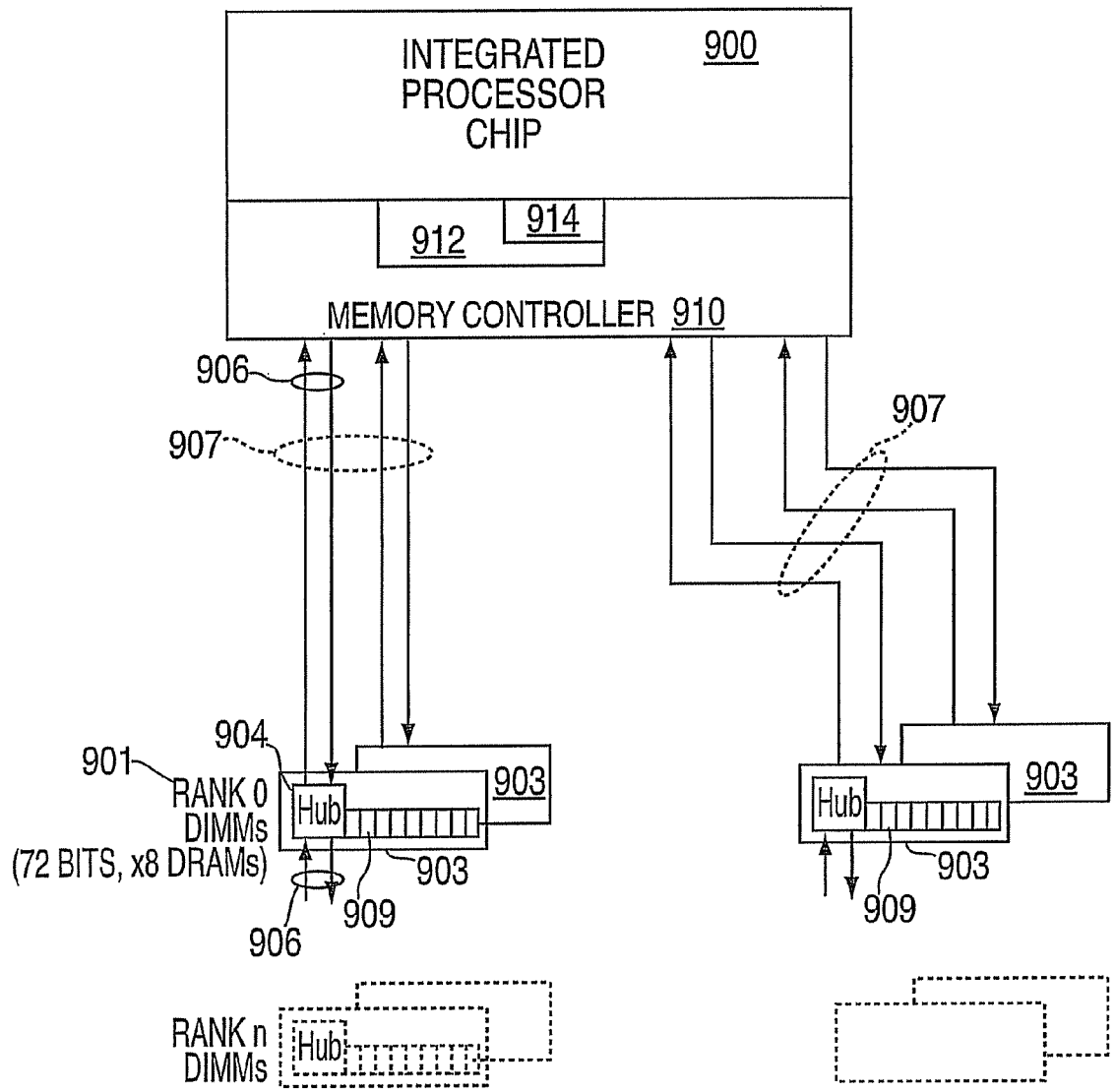
FIG. 9 depicts an exemplary memory structure that may be utilized to implement one of the configurations depicted in FIG. 8.

FIG. 9 is an exemplary version of the system shown in FIG. 5, which is consistent with the memory module structure in the DDR3 configuration 804 depicted in FIG. 8, and includes additional elements in the memory controller 910. The additional elements include an ECC logic block 912 and a syndrome trapper block 914. The memory controller 910 attaches to four narrow/high speed point-to-point memory busses 906, with each bus 906 connecting one of the several unique memory controller interface channels to a cascade interconnect memory subsystem 903 (or memory module) which includes at least a hub device 904 and one or more memory devices 909. In the exemplary embodiment, each memory channel 907 (two are shown in this example, although one channel or more than two channels may exist in a given system configuration) is populated with at least two memory subsystems (e.g., 72 bit DIMMs produced with x8 devices having a minimum burst length of 8), populated such that the memory subsystem 903 are accessed in unison to provide the desired cache line size (128 bytes, in this case). The 128 byte cache line would be constructed over eight DRAM beats (8 bytes per DIMM×2 DIMMs×8 beats=128 bytes of data). The ECC logic 912 operates in a manner similar to that of contemporary ECC-enabled memory controllers, with check bits generated across a known data width for information (e.g. data, tags, address, command, controls and/or other signals) being sent from the memory controller 910 to one or more memory subsystems 903, hubs 904, repeaters and/or other devices to which the memory controller 910 is directly or indirectly connected. Upon receipt of information at the memory controller 910, the ECC logic 912 generates a new set of check bits across the received information (e.g. data, tags, address, command, controls, status, etc), with the ECC calculation generally completed across the same information content for both the sending and receiving such that a direct comparison can be made between the sent and received data, and any error identified.

In exemplary embodiments, a minimal portion of the available error correction capacity is exchanged for the ability to detect certain classes of error patterns. This is accomplished through the use of a new construct referred to herein as a "syndrome trapper" 914, which identifies error patterns that represent errors that have the potential of being mis-corrected, and informs a standard error control decoding algorithm of the presence of these possible errors. A small number of correctable error patterns will also be trapped by the syndrome trapper 914, leading to a loss of error correction capacity for these errors. As a result of this tradeoff, a goal of the syndrome trapper 914 is to detect every single error pattern in a given class and sacrifice as few correctable error patterns as possible.

Exemplary embodiments of the syndrome trapper 914, as described herein below, operate such that any non-zero syndrome(s) is analyzed to determine if the syndrome matches a characteristic signature that indicates a potential error affecting two chips. The example described below applies to double chip errors in which the failure in the second chip is relatively minor; for example, a single bit error or the failure of an I/O pin. If such a potential double chip error exists, the syndrome trapper 914 flags the error and normal system operation is halted. In exemplary embodiments, the system will attempt to recover from the failure, by methods such as, but not limited to, executing memory self-test to determine the cause and type of failure(s) contributing to the error. In some cases, the cause of the failure may be easily corrected, such as by a re-mapping of an interconnect wire and/or contact (also referred to as a spare bit lane). Once the failure is corrected, system execution may be re-started. At a minimum, the failing signature(s) is analyzed to provide guidance to the repair technician to quickly and accurately repair the defective system element.

Typically, when a word is written into ECC-protected memory, the ECC bits (also referred to herein as check bits) are computed by a set of XOR trees. When the word is read back, the XOR trees use the data read from the memory to re-compute the ECC bits. The recomputed ECC bits are compared to the ECC bits read from the memory. Any discrepancy indicates an error. By looking at which ECC bits don't match, it is possible to identify which data or ECC bit is in error, or whether a double-bit error occurred. In practice this comparison is done by an XOR of the read and recomputed ECC bits.

The result of this XOR is called the syndrome. If the syndrome is zero, no error occurred. If the syndrome is non-zero, then it can be used to index a table to determine which bits are in error, or to determine that the error is uncorrectable. Exemplary embodiments of the syndrome trapper 914 described herein relate to the syndrome bits that result from the XOR of the received and re-computed check bits.

Using conventional buffered DIMMs 903, a data bus width of 72 bits is available on each DIMM (typically by accessing nine, 8 bit wide or 18, 4 bit wide memory devices), providing additional data bits to enable the use of ECC to identify and correct most data errors. As with FIGS. 3 and 4, the data path ECC circuitry 912 would generally be located in the memory controller 910, and include the check bit generation and subsequent error detection and correction.

Although contemporary memory ECC structures may be implemented as described relative to FIGS. 3-5, the location of the ECC function may reside in other system elements, including the processor(s) themselves, the memory hub, register, buffer or other memory interface device residing between the memory controller and the memory devices, or in the memory device(s) themselves.

As depicted in the exemplary embodiment in FIG. 9, a memory system includes two or more memory modules 903 operating in unison in response to memory read requests. Each memory module 903 includes one or more memory devices 909. The memory system also includes a processor (e.g., the syndrome trapper 914) that includes logic for facilitating calculating one or more signatures associated with data returned in response to a memory read request that contains an error. It is determined if the error is a potential correctable error. If the error is a potential correctable error, then the calculated signatures are compared to one or more signatures in a trapping set. The trapping set includes signatures associated with uncorrectable errors (e.g., potential double symbol errors). An uncorrectable error flag is set (e.g., by ECC logic 912 and/or the syndrome trapper 914) in response to determining that at least one of the calculated signatures is equal to a signature in the trapping set.

Exemplary embodiments described herein include a general class of syndrome trappers 914 which detect a range of key error patterns (specified in exemplary embodiments in a "trapper set" that includes the key error patterns) while sacrificing a minimal amount of error correction capacity. The basic error model assumes that errors often occur in bursts, an assumption that is consistent with contemporary memory device and subsystem storage structures and operation.

Figure 10:
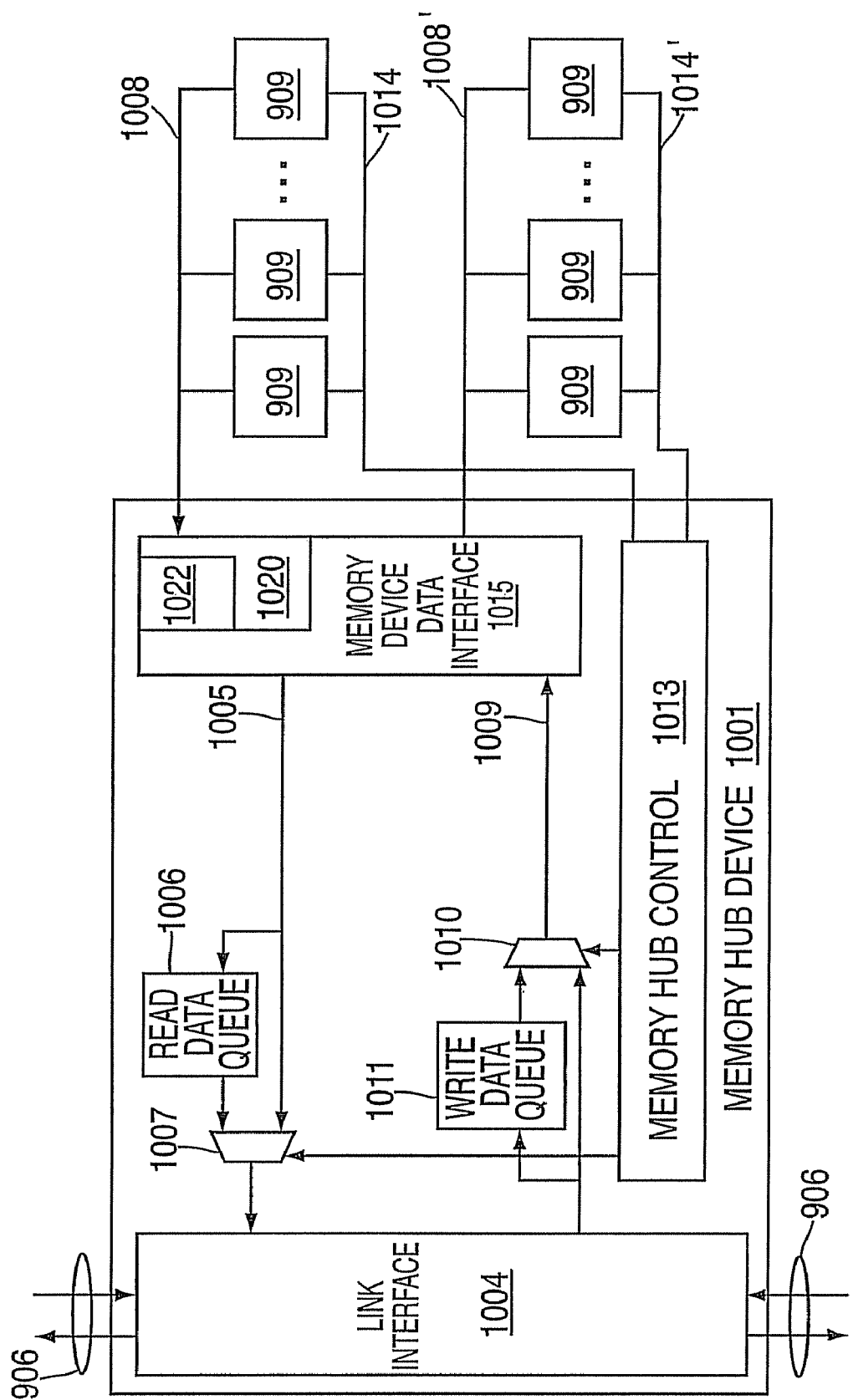
FIG. 10 depicts an exemplary hub device that may be utilized to implement exemplary embodiments.

FIG. 10 is an exemplary memory hub device 1001, which has similar function to the hub device 904 shown in FIG. 9, and which is adapted to include the exemplary syndrome trapper 1022 in the hub device 1001. In this exemplary embodiment, the system environment shown in FIG. 9 is retained, however the data path ECC is implemented in the hub device 1001, with the data path ECC circuitry 912 and syndrome trapper 914 in FIG. 9 either disabled or not implemented. As with FIG. 9, the memory controller 910 attaches to one or more narrow/high speed point-to-point memory busses 906, with each bus 906 connecting one of the several unique memory controller interface channels to a cascade interconnect memory subsystem 903 (or memory module) which includes at least the hub device 1001 and one or more memory devices 909. The ECC logic 1020 operates in a manner similar to that of contemporary ECC-enabled memory controllers/interface devices, with check bits generated across a known data width (sourced on memory device data interface inputs 1009) for data being sent from the memory controller 910 to memory subsystems 903. The memory subsystems 903 contain the hub device 1001 and may also include repeaters or other devices to which the memory controller 910 is directly or indirectly connected. During read accesses, data sourced from memory device(s) 909 are received by the memory device data interface 1015, and passed to ECC logic 1020. The ECC logic 1020 generates a new set of check bits across the received data, and identifies any errors.

The syndrome trapper 1022 also operates in a manner described later in this text, whereby any non-zero syndrome(s) is further analyzed, using the described algorithm(s), to determine if the syndrome matches a characteristic signature that indicates that an error affecting a single chip and an additional symbol error may exist. In an alternate exemplary embodiment, errors affecting a single chip and the failure of an I/O are trapped by an appropriate mapping of the data bits in the chips to the bits in the code in addition to utilizing an improved signature management algorithm. If this is the case, the syndrome trapper 1022 flags the error and normal system operation is halted. As with the operation in FIG. 9, in exemplary cases, the system will attempt to recover from the failure, by such methods as executing memory self-test (either locally initiated in the hub device 1001, by the memory controller 910, or by another device such as a service processor which monitors error conditions via the high speed link(s) or another interface). In some cases, the cause of the failure may be easily corrected, such as by the re-mapping of an interconnect wire and/or contact (also referred to as a spare bit lane), at which point the remaining error may be correctable, and system execution re-started. In a minimum exemplary case, the failure signature(s) is analyzed to provide guidance to the repair technician to quickly and accurately repair the defective system element. A memory hub device 1001 such as that shown in FIG. 10 offers advantages to systems that utilize the memory hub device 1001. Decoupling the memory fault-tolerant techniques from the memory controller allows system customers to select memory subsystems (e.g. ECC DNIMs) at various price/performance/reliability points, based on their unique requirements.

As depicted in FIG. 10, an exemplary embodiment includes ECC logic 1020 and syndrome trapping logic (also referred to herein as a syndrome trapper 1022). The ECC logic 1020 determines if data contains an error. The syndrome trapper 1022 (or syndrome trapping logic) performs a method in response to the data containing an error. The method includes calculating one or more signatures for the data. It is determined if the error is a potential correctable error. If the error is a potential correctable error, then the calculated signatures are compared to one or more signatures in a trapping set. The trapping set includes signatures associated with uncorrectable errors. An uncorrectable error flag is set in response to determining that at least one of the calculated signatures is equal to a signature in the trapping set. One example of where this embodiment could be utilized is for configuration where a cache line is sourced from memory devices 909 attached to a single hub device 1001.

Figure 11:
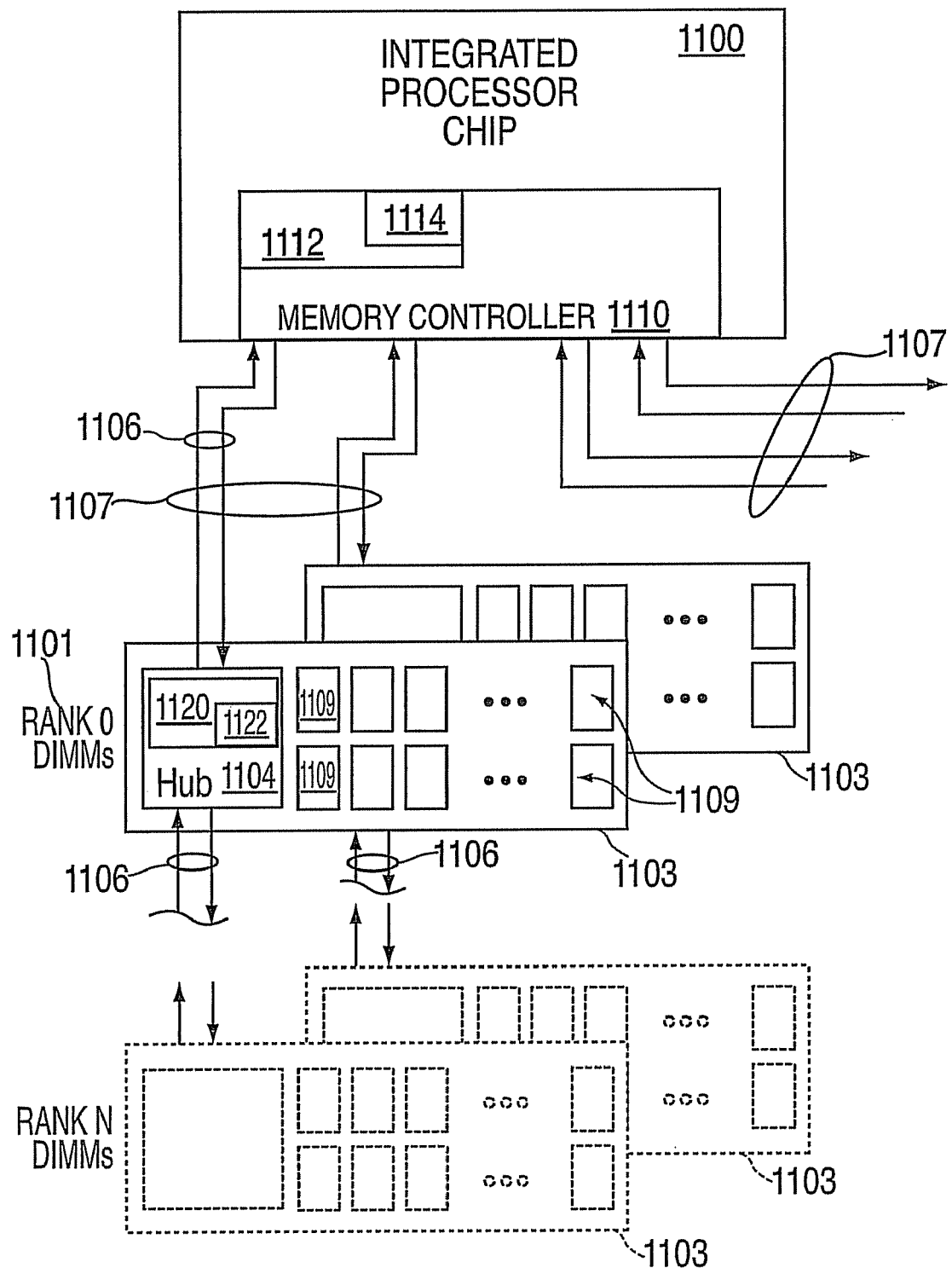
FIG. 11 depicts an exemplary memory system that may be utilized to implement exemplary embodiments.

FIG. 11 is similar to the system depicted in FIG. 5 and includes additional elements in the memory controller 1110, which is located in integrated processor 1100. The memory controller 1110 includes an ECC logic block 1112 and a syndrome trapper block 1114. The memory controller 1110 attaches to four narrow/high speed point-to-point memory busses 1106, with each bus 1106 connecting one of the several unique memory controller interface channels to a cascade interconnect memory subsystem 1103 (or memory module). Each memory subsystem 1103 includes at least a hub device 1104 and one or more memory devices 1109. In the exemplary embodiment depicted in FIG. 11, each memory channel 1107 (two are shown in this example, although one channel or more than two channels may exist in a given system configuration) is populated with at least two memory subsystems 1103 (e.g., 72 bit DIMMs produced with x8 devices having a minimum burst length of 8) such that the memory subsystems 1103, or memory modules, are accessed in unison to provide the desired cache line size (128 bytes, in this case). The 128 byte cache line is constructed over eight DRAM beats (8 bytes per DIMM×2 DIMMs×8 beats=128 bytes of data). The ECC logic 1112 operates in a manner similar to that of contemporary ECC-enabled interface busses and/or channels, with check bits generated across a fixed bus width. In the exemplary embodiment depicted in FIG. 11, the ECC is applied across the information transferred across the bus 1106, over multiple cycles (beats), and includes address, command, data and/or other information transferred between the memory controller 1110 and the one or more hub devices 1104. Upon receipt of the information at the hub device 1104, the ECC logic 1120 generates a new set of check bits across the received information with the ECC calculation applied across the same information content as done by the memory controller 1110. Thus, a direct comparison can be made between the sent and received data, and any error identified.

The syndrome trapper 1122 operates in a manner described later in this text, where any non-zero syndrome(s) is further analyzed, using the described algorithm(s), to determine if the syndrome matches a characteristic signature that indicates that an error affecting a consistent symbol position exists (e.g. the first symbol in a group of 'm' symbols transferred in parallel across the bus over multiple beats) in addition to an additional symbol error (e.g., a total of 4 symbol errors over 4 beats, in addition to one other symbol error). If this is the case, the syndrome trapper flags the error and normal system operation is halted. In exemplary cases, the system will attempt to recover from the failure, by such methods as executing a bus self-test to determine the cause and type of failure(s) contributing to the error. In some cases, the cause of the failure may be easily corrected, such as by the re-mapping of a bit lane that is found to be defective, and thereby affecting a consistent symbol position within the bus (the re-mapped bit lane may be accomplished via a spare bit lane). Upon replacement of the defective bit lane, any remaining error(s) may be correctable, and system execution may be re-started.

Figure 12:
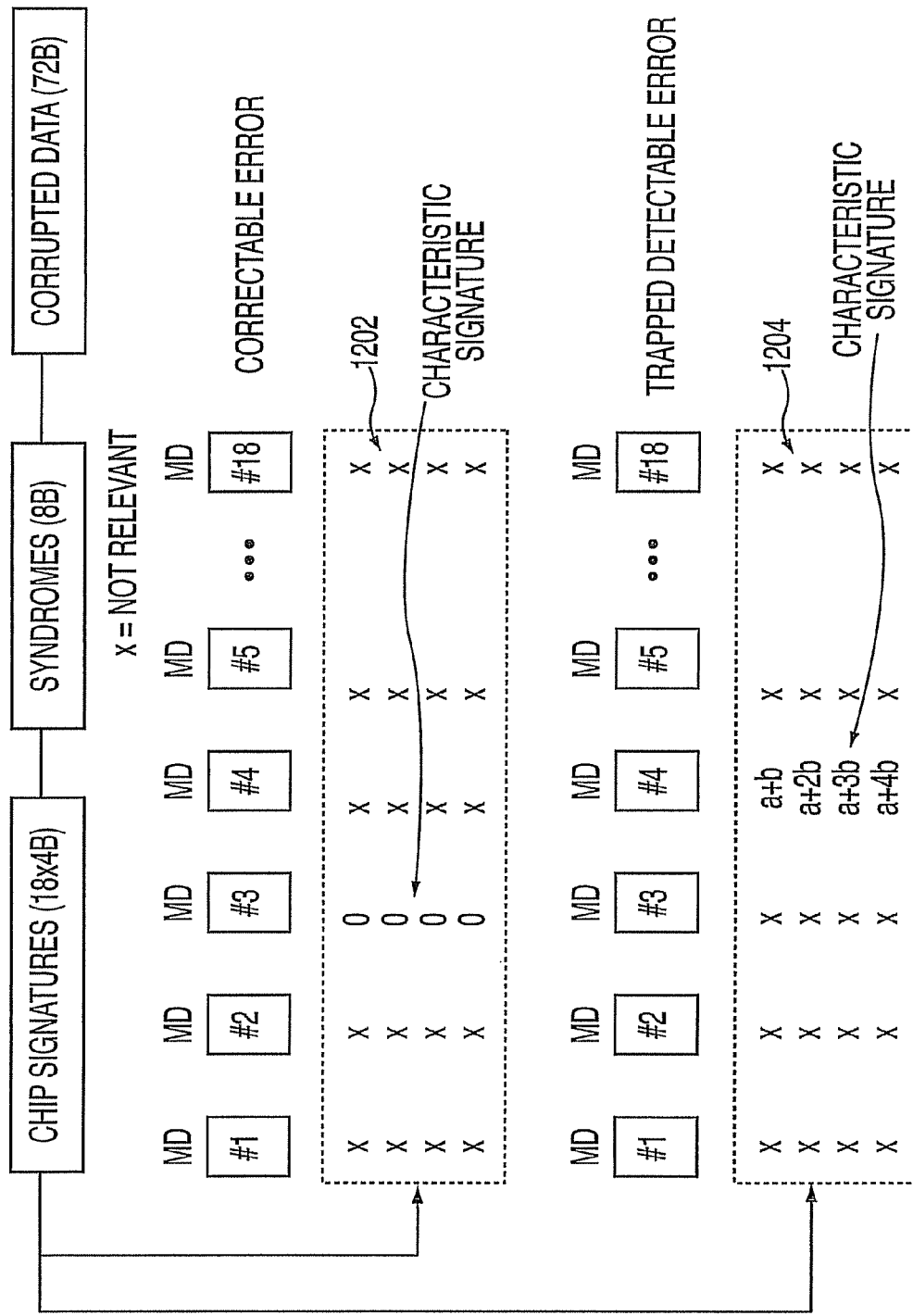
FIG. 12 depicts an exemplary algorithm that may be implemented by exemplary embodiments.

An exemplary embodiment of a syndrome trapper is shown in FIG. 12, and relates to a computer memory subsystem which employs a ninth redundant chip for every 8 data chips, in conjunction with a 128B cache line. With the use of individual DRAM devices having 8 I/O outputs and operating with a burst length of 8 (so that every DRAM chip produces a total of 8 bytes over 8 beats), a total of 16 data DRAM chips and 2 check bit DRAM chips are required to provide one cache line in a single parallel access to the 16+2 DRAMs. By applying a [72, 64] GF(256) Reed-Solomon code twice, each time across 4 DRAM beats of the 16+2 interface, consistent with the memory structure of the DDR3 configuration 804 depicted in FIG. 8, any four errors can be corrected using contemporary algorithms and methods (e.g., a failure associated with a single DRAM I/O for each of the 4 beats will be correctable). This solution, however, does not guarantee that all double chip errors (e.g. 5 byte errors and greater) will not be mis-corrected.

In another exemplary embodiment, a single memory subsystem having a data width of 144 bits may be used (instead of two 72 bit memory subsystems 1103) with the 128 byte cache line being constructed over 8 beats. The single memory subsystem may utilize the memory channel 1107 depicted in FIG. 11 which includes two memory busses 1106, a single wider memory bus (e.g., 144 bits), or a single memory bus 1106 with additional transfers. Other module width, cache line size and/or memory device burst length combinations may be implemented. One example of another combination is a single 72 bit memory subsystem 1103 being used in conjunction with a larger cache size (e.g., 256 bytes)

By implementing a system design with a [72, 64] GF(256) Reed-Solomon code twice, each time across 4 DRAM beats of the 16+2 interface, consistent with the memory structure of the DDR3 configuration 804 depicted FIG. 8, the following characteristics will apply:

Any up to 4 symbol errors are correctable (e.g. a chip kill, resulting in 4 symbol errors, with each of the symbols related to the same byte position for each of the 4 beats);

Any 8 byte error (two chip kills, across 4 beats) will return a non-zero syndrome (e.g., the errors are detectable);

Some 9 byte errors will have syndromes that equal 0—which will appear as 'good' data; and Some chip kills (e.g. 4 symbol errors, with each of the symbols related to the same byte position for each of the 4 beats) may be mis-corrected when one or more additional error(s) is present in the ECC word (e.g., 5 symbols to 8 symbols in error).

By applying the exemplary syndrome trapper to analyze the syndromes prior to completing a memory access, improved fault detection can be obtained over prior methods. Exemplary embodiments of the present invention permit the detection of any random symbol error in addition to the aforementioned 4 error (symbols), such as related to a chip kill, which can be corrected using the contemporary algorithms. In the upper table 1202 in FIG. 12, the syndromes associated with the 18 memory chips are analyzed by the syndrome trapper to determine if there is the possibility that a single chip error plus an additional error will be mis-corrected. This analysis includes the computation of a signature for every chip in the system. It is shown in a subsequent section herein that if a correctable error exists in a chip, then the signature of that chip consists of the "all zeros" vector (it is important to note that the opposite is not true, that the existence of an "all zeros" vector does not imply that a correctable error exists). Moreover, no other chip will have "all zeros" as its corresponding signature. This is illustrated in the upper table in FIG. 12, where the correctable error in the $3^{rd}$ column (memory device #3) has the corresponding signature (all zeroes) beneath it.

Further, in subsequent teachings herein, it is demonstrated that up to a 4 symbol error in a chip (e.g. memory device #4 in the lower table 1204 in FIG. 12) together with any other error in a different chip (e.g. a 5 byte error) always results in a signature of the former chip that can be written as $\alpha[\beta \ \beta^2 \ \beta^3 \ \beta^4]$, for some nonzero elements $\alpha$, $\beta$ of the Galois Field. It is well known in the art that every element of a Galois Field can be expressed as the power of another element of the Galois Field called a primitive element. Denoting by $\omega$ such a primitive element, the signature alluded to above is such that the elements of the signature have exponents of $\omega$ that can be written as a+b, a+2b, a+3b, a+4b, for some integers a,b. Another observation that we make in the subsequent teachings is that single symbol errors result in all but one of the chip's signatures equal to $\alpha[\beta \ \beta^2 \ \beta^3 \ \beta^4]$ for some nonzero elements $\alpha,\beta$ of the Galois Field, with the other chip signature being equal to zero. Moreover, if there are two or three errors in a chip then it is shown that it is impossible for any of the chip's signatures to be written as $\alpha[\beta \ \beta^2 \ \beta^3 \ \beta^4]$ for some nonzero elements $\alpha$, $\beta$ of the Galois Field.

Exemplary embodiments utilize the two findings above to create an error handling policy that corrects an error only when: (1) exactly one chip signature is the "all zeros" vector; and (2) no chip signature is identified as $\alpha[\beta \ \beta^2 \ \beta^3 \ \beta^4]$ for nonzero elements $\alpha$, $\beta$ of the Galois Field, unless it is apparent that the error involved is a single symbol error (a method for making this determination is taught herein below). Any other syndromes are trapped and correction is not attempted since this could result in mis-correction, with erroneous data being utilized.

A further exemplary embodiment allows for a variable latency decoding (or alternatively, early data release) with the goal of further diminishing the fraction of chip errors that are sacrificed. In the example shown in FIG. 12, as related to the memory structure shown in the DDR3 configuration 804 in FIG. 8, the algorithm applies to 4 DRAM beats and is applied twice over the entire DRAM output of 8 beats.

When the syndrome trapper finds in the first 4 DRAM beats a syndrome that could be due to a full chip error or an error pattern consisting of a full chip error and any additional error then instead of immediately calling the error uncorrectable, it assumes that it is only due to a single full chip error and decodes accordingly. Nevertheless, the decoder either delays delivery of the data or alternatively delivers the data with the understanding that it may later be identified as uncorrectable after the next 4 DRAM beats are processed, resulting in the need to halt system operation or take other recovery operations.

Upon receipt of the data associated with the second 4 DRAM beats, the syndrome trapper correlates the results with any errors found in the first group of 4 DRAM beats. If discrepancies are found in this comparison, the entire data (the data associated with all 8 beats) is not correctable. Otherwise it is labeled correctable.

Figure 13:
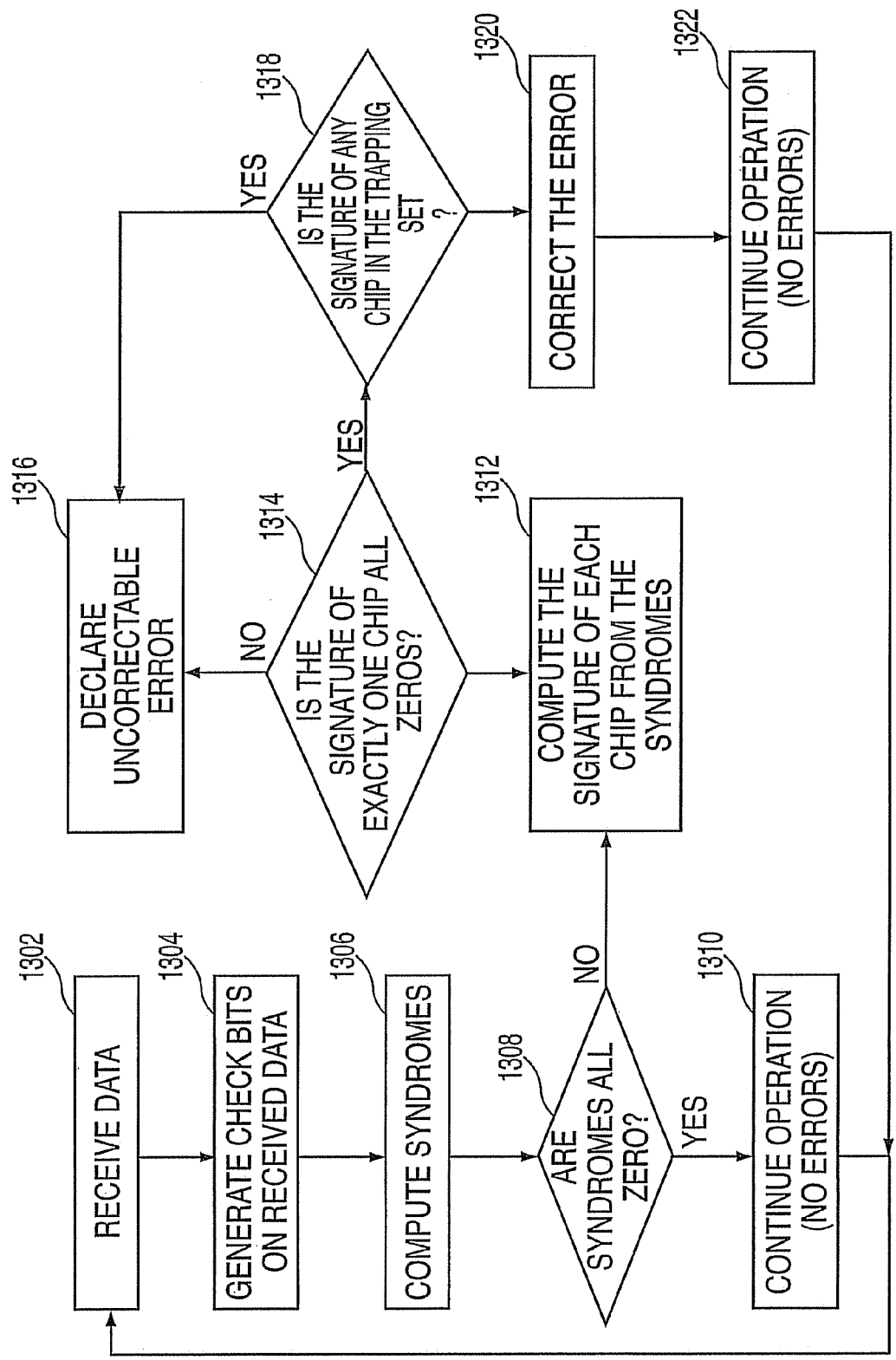
FIG. 13 depicts an exemplary process flow that may be implemented by exemplary embodiments.

FIG. 13 is a flow chart of an exemplary process that may be implemented by the ECC logic block and/or the syndrome trapper block to analyze each memory access to determine if an uncorrectable error exits. In exemplary embodiments, blocks 1302-1310 and blocks 1320-1322 are performed by logic in a contemporary ECC logic block and blocks 1312-1318 are performed by logic in a syndrome trapper block (other divisions of processing may also be implemented by an exemplary embodiment). The exemplary process in FIG. 13 implements an error handling policy that corrects an error only when: (1) exactly one chip (also referred to herein as a memory device) signature is the "all zeros" vector; and (2) no chip signature is identified as a signature contained in a trapping set (containing, for e.g., [d d^2 d^3 d^4] for any element d of the Galois Field, unless it is apparent that the error involved is a single symbol error). Any other syndromes are trapped and correction is not attempted since this could result in mis-correction, with erroneous data being utilized.

Referring to FIG. 13, at block 1302, data is received by the ECC logic block. At block 1304, check bits are generated for the data received at block 1302. At block 1306 syndromes are computed (e.g., by performing an exclusive-or of the generated check bits and the check bits received with the data at block 1302). At block 1308, a check is made to determine if all of the syndromes are equal to zero. If all of the syndromes are equal to zero, then no errors have been detected and block 1310 is performed to continue operation. Processing then continues at block 1302.

If it is determined, at block 1308, that all of the syndromes are not zero (i.e., that an error is present), then block 1312 is performed and the signature of each chip is computed from the syndromes. Next, block 1314 is performed to determine if the signature of exactly one chip is all zeros (i.e, if the error is a correctable error). If the signature of exactly one chip is all zeros, then block 1318 is performed to determine if the signature of any chip is in the trapping set. Note that in exemplary embodiments a signature (s1, s2, s3, . . . , sn) is in the trapping set if si=ab$^i$ for some two Galois field elements a, b and for all i=1, . . . , n and an additional condition described in subsequent teachings. If the signature of any chip is in the trapping set, then block 1316 is performed because there is a possibility that a second, undetected error is present and that correction of the error may result in a mis-correction of the error. At block 1316, the error is determined to be an uncorrectable error. In exemplary embodiments, the system operation will halt, in other embodiments, a recovery method could be performed to attempt a correction of the uncorrectable error. If, at block 1314, it is determined that it is not the case that the signature of exactly one chip is all zeros, then the error is an uncorrectable error and processing continues at block 1316.

If, at block 1318, it is determined that the trapping set does not contain the signature of any of the chips (i.e., the error is correctable), then block 1320 is performed to correct the error. Next, block 1322 is performed to continue the operation of the system. Processing then continues at block 1302 where more data is received.

The exemplary embodiment of the syndrome trapping process described in reference to FIG. 13 includes calculating one or more signatures associated with data that contains an error at block 1312. It is determined if the error is a potential correctable error at block 1314 by determining if exactly one of the signatures is equal to all zeros. If the error is a potential correctable error, then block 1318 is performed and the calculated signatures are compared to one or more signatures in a trapping set. The trapping set includes signatures associated with uncorrectable errors. An uncorrectable error flag is set at block 1316 if at least one of the calculated signatures is equal to a signature in the trapping set. Otherwise, the error is corrected at block 1320 and operation of the system continues.

The example above is a specific embodiment of a general framework that is applicable to other settings. The concepts, background and details of how the above can be implemented, as well as a general description of the associated algorithms, is included below.

Figure 14:
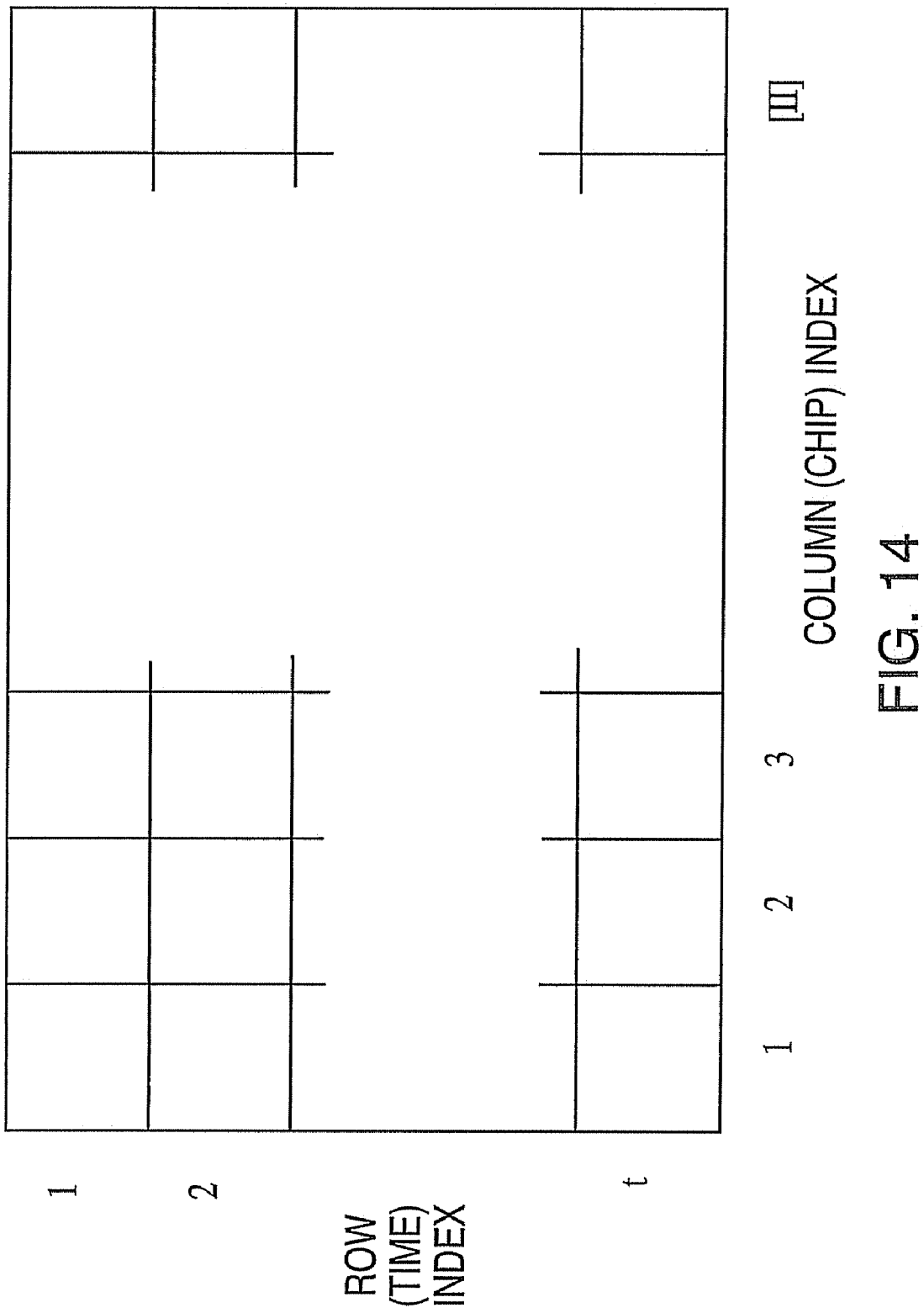
FIG. 14 depicts a memory geometry that may be utilized by exemplary embodiments.

Introduction to concepts behind exemplary supporting algorithms. In the problem addressed herein, the physical implementation of a memory is obtained using multiple memory chips $\Pi=\{1 \ldots, |\Pi|\}$ which are accessed in parallel in any given request. Every time the memory is accessed (for a read or a write), each chip delivers or accepts a total of t symbols from the Galois Field of size q (denoted GF(q)) over time. For reasons that shall become apparent, it is always assumed that t≧3. It is also assumed that q is a power of 2 (typically, q=256 in the applications of concern). In such a field, addition and subtraction are the same operation and can be implemented in hardware using an XOR operation. This geometry is depicted in FIG. 14, where different columns correspond to the data stored in different chips, and rows describe the data that each chip gives on any of a total of t time indices. For the purposes of error protection, each line stored in this memory employs a Reed-Solomon code with a total of 2t symbols of redundancy. It is assumed that t|Π|<q, so that a Reed-Solomon code exists. It is further assumed that the codeword from the Reed-Solomon code, which consists of a linear sequence of symbols, is mapped to the geometry of FIG. 14 so that the symbol in row i and column j corresponds to the symbol i+(j−1)t in the Reed-Solomon codeword (in other words, the symbols are assigned from the top to the bottom, and then left to right). The precise physical location of the 2t redundant symbols is irrelevant for the purposes of this work. An error pattern that is of particular interested is one which affects at most an entire column (when this error is persistent and involves the entire column, the error event is termed a "chip-kill"). Another error pattern of key interest is one in which errors affect exactly two columns, but one of the columns has exactly one error. The last error pattern, when it affects t+1 symbols, always results in a nonzero syndrome, and sometimes will result in a mis-correction by a standard Reed-Solomon decoding algorithm. Exemplary embodiments described herein demonstrate a simple means of making this mis-correction impossible by exploiting tradeoffs between the error detection and error correction capacity of an error control code.

The codeword stored in the memory is represented by the column vector $A=[A_1 \ A_2 \ldots A_{t|\Pi|}]^T$ (each $A_i$ is an element of GF(q)). Let ω denote a primitive element of GF(q), so that the nonzero elements of GF(q) can be expressed as powers of ω. The j th position in the vector A will be associated with the GF(q) element $\omega^j$ (j∈{1, . . . , t|Π|}. We define $\Gamma=\{\omega, \omega^2, \ldots, \omega^{t|\Pi|}\}$.

Assume that there are exactly 0<v≦t+1 errors with locations $(X_1, X_2, \ldots, X_v)$ and error magnitudes $(E_1, E_2, \ldots, E_v)$. Multiplying the parity check matrix H of the Reed-Solomon code times the vector retrieved from memory (consisting of the originally stored data plus a potential error pattern) results in the 2t syndromes $S_1, \ldots, S_{2t}$, the syndromes computed from the received data. $M^\mu$ denotes the standard syndrome matrix for u errors and $M_E^\mu$ denotes the extended syndrome matrix for μ errors. The former is a μ×μ matrix whereas the latter is a μ×(μ+1) matrix; these are jointly defined by $$M_E^\mu \triangleq \left[ M^\mu \begin{array}{c} S_{\mu+1} \\ S_{\mu+2} \\ \vdots \\ S_{2\mu} \end{array} \right] \triangleq \begin{bmatrix} S_1 & S_2 & \cdots & S_\mu & S_{\mu+1} \\ S_2 & S_3 & \cdots & S_{\mu+1} & S_{\mu+2} \\ \vdots & & & \vdots & \vdots \\ S_\mu & S_{\mu+1} & \cdots & S_{2\mu-1} & S_{2\mu} \end{bmatrix}$$

The true error locator polynomial Λ(x) is the unique polynomial whose roots are exactly $(X_1^{-1}, X_2^{-1}, \ldots, X_v^{-1})$:

$$\Lambda(x)=\Pi_{i=1}^v(1-xX_i)=\Lambda_v x^v + \ldots + \Lambda_1 x + 1 \qquad (1)$$

The label "true" is attached to the above because in some instances of the discussion below, test error locator polynomials are used which need not have roots associated with the true inverse locations.

Let $\Lambda=[\Lambda_v \ldots \Lambda_1 \ 1]^T$. Any column vector (regardless of its length) whose last entry is 1 is termed a proper vector. A key property of interest of $M_E^v$ is that $\underline{\Lambda}$ is the unique proper vector satisfying $$M_E^v \underline{\Lambda}=0 \qquad (2)$$

Next note that when the error pattern consists of t consecutive errors $(X_i=X_1\omega^{i-1}$ for i=1, . . . , t), the error locator polynomial satisfies $$1+\Lambda_1 x + \ldots + \Lambda_t x^t = \Pi_{i=1}^t(1-xX_1\omega^{i-1}) \qquad (3)$$

From the fact that $X_1$ and x appear multiplied together in (3) it can be deduced that $$\Lambda_i = X_1^i \kappa_i, \ 1 \leq i \leq t \qquad (4)$$

for constants $\{\kappa_i\}_{i=1}^t$ that do not depend on $X_1$. It is assumed that the starting location of the t consecutive errors is restricted to model the chip failure event. This translates into the assumption that $$X_1 \in \Pi$$

for a given set $\Pi = \{l_1, l_2, \ldots, l_{|\Pi|}\}$, called the set of pivots. Note that for any $1 \leq j \leq |\Pi|$, $$l_j \omega^{i-1} \notin \Pi 2 \leq i \leq t$$

The equations in (4) motivate making the following definition: given $\xi \in \Pi$, $\underline{\lambda}(\xi)$ is the t+1 column vector given by $$\underline{\lambda}(\xi) = [\xi^t \kappa_t \ldots \xi \kappa_1 1]^T$$

Note that $\underline{\lambda}(\xi)$ is a proper vector. It also represents the coefficients of a polynomial with zeros exactly equal to the t inverse locations of the symbols of the column to which $\xi$ belongs. A signature is a pair of the form (r, S), where r is boolean and S is a t×|Π| matrix. With the exception of the all zeros case, each possible value for the syndromes is associated with a signature given by $$S = M_E^t [\underline{\lambda}(l_1) \; \underline{\lambda}(l_2) \; \ldots \; \underline{\lambda}(l_{|\Pi|})]$$

$$r = \begin{cases} \text{true} & \text{if the rank of } M^t \text{ is 1} \\ \text{false} & \text{otherwise} \end{cases}$$

The set of signatures are divided in two disjoint sets, the pass set and the halt set. A signature (r, S) belongs to the pass set if and only if the following two conditions are met:
1. There exists exactly one column of S that is all zeros.
2. If r is false, then no column of S can be expressed as $\alpha[1 \; \beta \; \ldots \; \beta^{t-1}]^T$ with $0 \neq \alpha \in GF(q)$ and $\beta \in \Gamma$.

In the analysis described herein, the fact that $M_E^\mu$ admits the following well known matrix factorization is relied on:

$$M_E^\mu = \begin{bmatrix} 1 & 1 & \cdots & 1 \\ X_1 & X_2 & \cdots & X_v \\ \vdots & & & \vdots \\ X_1^{\mu-1} & X_2^{\mu-1} & \cdots & X_v^{\mu-1} \end{bmatrix} \begin{bmatrix} X_1 E_1 & 0 & \cdots & 0 \\ 0 & X_2 E_2 & \cdots & 0 \\ \vdots & & & \vdots \\ 0 & 0 & \cdots & X_v E_v \end{bmatrix} \begin{bmatrix} 1 & X_1 & \cdots & X_1^\mu \\ 1 & X_2 & \cdots & X_2^\mu \\ \vdots & & & \vdots \\ 1 & X_v & \cdots & X_v^\mu \end{bmatrix} \quad (5)$$

and it holds for any $1 \leq v \leq |\Gamma|$ and $1 \leq \mu \leq t$.

In this three matrix factorization, the first matrix is Vandermonde and the third matrix is the transpose of a Vandermonde matrix. An n×m matrix A is said to be Vandermonde if for some symbols $\xi_1, \ldots, \xi_m$ it can be written $$A_{i,j} = \xi_j^{i-1} \; 1 \leq i \leq n, \; 1 \leq j \leq m,$$

Using the shorthand notation $\underline{\xi} = [\xi_1 \; \xi_2 \ldots \xi_m]^T$, the resulting n×m Vandermonde matrix is denoted by $$V_{n \times m}(\underline{\xi})$$

If every element in $\underline{\xi}$ is distinct then the dimension of the range of $V_{n \times m}(\underline{\xi})$ is min(n,m).

It will also be useful to introduce notation for matrices with nonzero entries confined to their diagonal. Let $\underline{\xi}$ be either a row or column vector, then $$[diag(\underline{\xi})]_{i,j} = \begin{cases} \xi_i & \text{if } i = j \\ 0 & \text{if } i \neq j \end{cases}$$

If A and B are vectors with an identical number of symbols, the vector whose i th entry is equal to $A_i B_i$ is denoted by $A*B$.

With this notation, letting $\underline{X} = [X_1 \; X_2 \; \ldots \; X_v]^T$ and $\underline{E} = [E_1 \; E_2 \ldots E_v]^T$ formula (5) can be rewritten as $$M_E^\mu = V_{\mu \times v}(\underline{X}) diag(\underline{X} * \underline{E}) V_{\mu+1 \times v}(\underline{X})^T$$

Similarly, the standard syndrome matrix can be written as $$M^\mu = V_{\mu \times v}(\underline{X}) diag(\underline{X} * \underline{E}) V_{\mu \times v}(\underline{X})^T$$

In order to understand the product of $M_E^\mu$ times a $\mu+1$ column vector $\psi$ consider the inner product of the j th row of $V_{\mu+1 \times v}(\underline{X})^T$ with $\psi$ $$\sum_{i=0}^{\mu} \psi_{i+1} X_j^i = X_j^\mu \left( \sum_{i=0}^{\mu} \psi_{i+1} \left(\frac{1}{X_j}\right)^{\mu-i} \right)$$

$$= X_j^\mu \left( \sum_{i=0}^{\mu} \psi_{\mu-i+1} \left(\frac{1}{X_j}\right)^i \right)$$

Looking at $\psi$ as the coefficients of a polynomial, the first element being the coefficient of the largest power and the last one being the constant term, then the inner product above is seen to be proportional to the polynomial with coefficients $\psi$ evaluated at $1/X_j$. In particular, if $\mu = v$ and $\psi = \Lambda$ (the true error locator polynomial) then formula (2) is obtained.

Main results. A goal is to develop a decoding algorithm that ensures that no error affecting two columns, where one column has a single error, results in a mis-correction. In order to facilitate subsequent discussions, errors of this kind are referred to as type-II errors; any error confined to a single column is a type-I error. An (i)-type-I error is one in which the column in error is the i th one. A (j,k,l,a)-type-II error is one in which the k th column as a single error in row l, with magnitude a and the j th column has all of the other errors.

Type-II errors are of particular interest to memories of computer systems where error events affecting a single chip error plus an additional smaller error (for example a single bit error) are expected. Such events are never silent in the sense that their syndrome is always nonzero; this is because type-II errors only have weight t+1 and the minimum weight of any nonzero codeword of the Reed-Solomon code is at least 2t+1. Thus the only other possibility for mishandling type-II errors is when they are mis-corrected.

Throughout this section it is assumed that a decoder for type-I errors maps the syndrome of the error vector to the error vector itself. For mis-correction to take place for a given type-II error, it is necessary that its syndrome be identical to that of a type-I error or equivalently, that the sum of the type-I error and the type-II error results in a valid codeword of the Reed-Solomon code. From this argument it is observed that a necessary condition for a type-I error and a type-II error to have the same syndrome is that their combined weight is 2t+1 errors.

It is not difficult to show that there are some type-II errors with a syndrome identical to the syndrome of a type-I error, and hence some type-II errors will be mis-corrected; in what follows the existence of such errors is shown and also that there is a simple upper bound for how many can exist.

Let i, j, k∈Π be distinct column indexes. Also let l∈{1, . . . , t} be a row index, and let a be a nonzero element of GF(q). From these parameters a (i)-type-I error and a (j,k,l,a)-type-II error shall be constructed. The combined weight of these errors is 2t+1. These two errors will have identical syndromes.

First, let A be an array with all zeros entries except for its position in row l, column k in which the symbol is equal to a. Next give the array to a decoder and inform to it that the symbols in columns i and j are to be treated as erased positions, and that no other error exists in the vector. It is known that a Reed-Solomon code with 2t redundant symbols is capable of correcting up to 2t erasures, and thus such a decoder will populate the erased columns with symbols so as to make the entire array a valid codeword of the Reed-Solomon code, which will term Â. Such a valid codeword must have weight 2t+1 since the minimum distance of the code is 2t+1 and the all zeros vector is a valid codeword. Next, the error of type I (called $E_I$) is built by assigning every position to be equal to zero except for those positions assigned to the i th column, where the symbols are copied from the i th column of Â. A similar procedure is performed to construct the error of type II (denoted by $E_{II}$), copying the contents of the j th and k th columns of Â to those of $E_{II}$, and assigning the rest of the symbols to be equal to zero.

By construction $A=E_I+E_{II}$ and thus the syndromes of $E_I$ and $E_{II}$ are nonzero and identical to each other (recall that in this field, addition is identical to subtraction). This shows the existence of type-I and type-II errors with identical syndromes.

Next let ($E_I$, $E_{II}$) be error patterns obtained through the procedure described above using parameters (i,j,k,l,a) and let ($E_I'$, $E_{II}'$) be error patterns such that $E_I'$ is a (i)-type-I error, $E_{II}'$ is a (j,k,l,a)-type-II error and $E_I'+E_{II}'$ is a codeword of the Reed-Solomon code. The syndrome of $\Omega=(E_I+E_I')+(E_{II}+E_{II}')$ must be equal to zero, and yet the weight of $\Omega$ is at most 2t; as a consequence we get $\Omega=0$. This shows that $E_I=E_I'$ and $E_{II}=E_{II}'$.

Therefore there are at most $$(q-1)t|\Pi|(|\Pi|-1)(|\Pi|-2) \qquad (6)$$

type-I errors with a syndrome coinciding with the syndrome of a type-II error. A practical algorithm that raises a flag whenever the syndrome of a type-II error has been observed is described herein. This algorithm also raises the flag on some type-I errors; the number of such errors will be upper bounded by an expression slightly larger to (6).

The main result Algorithm 1. The algorithm operates under the assumption that the error pattern is either type-I or type-II. Algorithm 1 is a basic halt signature detection—preamble to a standard decoding algorithm:

1. Receive data to be decoded and compute the syndromes. If the syndromes are all equal to zero, go to step 4.
2. Compute the signature (r, S) of $M_E^t$. If the signature is in the halt set, then halt.
3. (Error Correction Step) Use a standard decoding algorithm to correct the errors. If the decoder fails to decode correctly, then halt.
4. End of the algorithm.

The main result theorem, Theorem 1. Assume that $t \geq 3$. If there are t-1 errors or less, the algorithm corrects them if they are confined to a column and halts otherwise. This algorithm halts for any type-II error. If there are exactly t errors:

If the errors are confined to a column, the algorithm halts on a fraction of these errors no greater than $$\frac{t|\Pi|(|\Pi|-1)}{(q-1)^{t-1}},$$

and otherwise corrects them.

If the errors are not confined to a column, the algorithm halts.

The proof of the main result algorithm. The proof is based in the following lemmas, which are proved later.

Lemma 1: If the number of errors satisfies $v \in \{0, \ldots, t\}$, then the rank of $M^t$ is v. On the other hand, if v=t+1, then the rank of $M^t$ is either t-1 or t.

Lemma 2: If the number of errors is in $\{1, \ldots, t-1\}$, then the syndrome signature is in the pass set if the errors are confined to a column and is in the halt set if the errors are not confined to a column.

Lemma 3: For a type-II error, the signature of the syndromes is not in the pass set.

Lemma 4: If the number of errors is t but they are not confined to a column, then the syndrome signature is in not in the pass set.

If there are t-1 errors or less, the algorithm corrects them if they are confined to a column and halts otherwise. The algorithm halts on all type-II errors. If there are exactly t errors not confined to a column, the algorithm halts. Proof: Evident from Lemmas 2, 3 and 4.

If there are t errors confined to a column, the algorithm halts on a fraction of these errors no greater than $$\frac{t|\prod|(|\prod|-1)}{(q-1)^{t-1}},$$

and otherwise corrects them. Proof: Assume that the signature is (r, S). In this case, there exists exactly one column of S that is all zeros. Lemma 1 implies that the rank of $M^t$ is $t \geq 3$ and therefore r is false. Thus for (r, S) to be in the halt set, at least one of the columns of S can be expressed as $$\alpha[1 \beta \ldots \beta^{t-1}]^T$$

with $0 \neq \alpha \in GF(q)$ and $\beta \in \Gamma$. First note that $$M_E^t \lambda(l_i) = V_{t \times t}(\underline{X}) diag(\underline{X}^* \underline{E}) V_{t+1 \times t}(\underline{X})^T \lambda(l_i)$$

Let i* be the index of the column which contains the t errors (so that $M_E^t \lambda(l_{i^*})=0$). Let $i \in \Pi \setminus \{i^*\}$. Let $\eta_i = V_{t+1 \times t}(\underline{X})^T \lambda(l_i)$. It can be seen that: $diag(X^*E)\eta_i = diag(\underline{X}^*\eta)E$; let $W_i = diag(\underline{X}^*\eta_i)$. Thus $M_E^t \lambda(l_i) = V_{t \times t}(\underline{X}) W_i \underline{E}$.

Let the set of bad error patterns for the column i be given by $$B_i = \{\underline{E} : V_{t \times t}(X) W_i \underline{E} = \alpha/1\beta \ldots \beta^{t-1}]^T \text{ for some } 0 \neq \alpha \in GF(q) \text{ and } \beta \in \Gamma\}$$

The set of all bad error patterns is $\cup_{i \in \Pi \setminus \{i^*\}} B_i$. Every element of the vector $\eta_i$ is nonzero and therefore $W_i$ is a matrix of full rank. Furthermore, $V_{t \times t}$ is also a matrix of full rank since it is a square Vandermonde matrix with distinct second row entries. Therefore $V_{t \times t}(\underline{X})W_i$ is a matrix of full rank, and $$|B_i| = (q-1)|\Gamma| 1 \leq i \leq |\Pi|$$

By a union bound, $$\left| \bigcup_{i \in \Pi \setminus \{i^*\}} B_i \right| \le (|\Pi| - 1)(q - 1)|\Gamma|$$

$$= t|\Pi|(|\Pi| - 1)(q - 1)$$

On the other hand, there are $(q-1)^t$ total possible error patterns affecting exactly t symbols and therefore the fraction of error patterns that have an associated syndrome signature in the halt set is no greater than $$\frac{t|\Pi|(|\Pi|-1)}{(q-1)^{t-1}}$$

Proof of Lemmas 1, 2, 3, and 4.

[Proof of Lemma 1.] Under the assumptions of the lemma $$M^t = V_{t \times (t+1)}(X_1^{t+1}) diag(X_1 E_1, \ldots, X_{1+1} E_{t+1}) V_{t \times (t+1)}(X_1^{t+1})^T$$

$$= V_{t \times (t+1)}(X_1^t) diag(X_1 E_1, \ldots, X_t E_t) V_{t \times (t+1)}(X_1^t)^T + E_{t+1} \eta \eta^t$$

where $\eta = [X_{t+1} \ldots X_{t+1}^t]^T$. Let C be the first matrix in the last summation. It is claimed that the rank of $C + E_{t+1} \eta \eta^T$ is at least t−1. Suppose otherwise, that the dimension of the nullspace is 2 or more. Let $a_1$ and $a_2$ be two linearly independent vectors in the nullspace. Note that $Ca_1$ and $Ca_2$ are also linearly independent since if there exists a factor $\rho$ such that $Ca_1 + \rho Ca_2 = 0$ then $C(a_1 + \rho a_2) = 0$ and since C has full rank, then $a_1 + \rho a_2 = 0$ in contradiction with the assumption that $a_1$ and $a_2$ are linearly independent. But $$Ca_i = E_{t+1} \eta (\eta^T a_i) i \in \{1,2\}$$

and thus both $Ca_1$ and $Ca_2$ are scalar multiples of the vector $\eta$. Thus $a_1$ and $a_2$ are not linearly independent which is a contradiction to the initial assumption.

[Proof of Lemma 2.] Assume that there are $1 \le v \le t-1$ errors and at least two columns have an error. $\underline{X} = [X_1, \ldots, X_v]^T$ and $\underline{E} = [E_1, \ldots, E_v]^T$. Recall that $$M_E^t = V_{t \times v}(\underline{X}) diag(\underline{X}^* \underline{E}) V_{t+1 \times v}(\underline{X})^T$$

$M_E^t \lambda(l_i) \ne 0$ for all $i \in \Pi$, which implies that the signature of this error is not in the pass set. The dimension of the range of the matrix product $V_{t \times v}(\underline{X}) \text{boxdiag}(\underline{X}^* \underline{E})$ is v, and therefore multiplying this matrix product times any nonzero vector with v entries will result in a nonzero vector.

Thus if $M_E^t \lambda(l_i) = 0$ for some $i \in \Pi$, then necessarily it must be true that $V_{t+1 \times v}(\underline{X})^T \lambda(l_i) = 0$. Recall that $\lambda(l_i)$ denotes the coefficients of a polynomial of degree t with zeros equal to the t inverse symbol locations assigned to column i; we shall denote by $\lambda(x, l_i)$ the polynomial in x derived from the coefficients in $\lambda(l_i)$:

$$\lambda(x, l_i) = (x - l_i)(x - l_i \omega) \ldots (x - l_i \omega^{t-1})$$

It has previously been argued that the j th entry of the product $V_{t+1 \times v}(\underline{X})^T \lambda(l_i)$ is proportional to $\lambda(X_j^{-1}, l_i)$. But since no single column has v errors, for every $i \in \Pi$ the vector $V_{t+1 \times v}(\underline{X})^T \lambda(l_i)$ must have at least one nonzero entry and then $M_E^t \lambda(l_i) \ne 0$.

Now assume there are $1 \le v \le t-1$ errors but all of them are confined to a single column $i^*$. First note that $M_E^t \lambda(l_{i^*}) = 0$ and thus the first condition for the signature to be in the pass set is satisfied. If there is exactly one error, then for any $i \in \Pi \setminus \{i^*\}$ there exist $0 \ne \alpha \in GF(q)$ and $\beta \in \Gamma$ such that $$M_E^t \lambda(l_i) = \alpha[1 \beta \ldots \beta^{t-1}]^T$$

but in this case the rank of the matrix $M^t$ is one and therefore the signature must be in the pass set. Assume that the number of errors satisfies $v \in \{2, \ldots, t-1\}$ which is a non-empty set since it is assumed that $t \ge 3$ (this was required by Lemma 3). The proof is finished by contradiction. Let $i \in \{1, \ldots, |\Pi|\} \setminus \{i^*\}$, $0 \ne \alpha \in GF(q)$ and $\beta \in \Gamma$ be such that $$M_E^t \lambda(l_i) = \alpha[1 \beta \ldots \beta^{t-1}]^T \qquad (8)$$

Recall that $$M_E^t = V_{t \times v}(\underline{X}) diag(\underline{X}^* \underline{E}) V_{t+1 \times v}(\underline{X})^T$$

where $\underline{X} = [X_1 \ldots X_v]$ are the locations of the errors and $\underline{E} = [E_1 \ldots E_v]$ is the error vector.

Since none of the entries of the vector $V_{t+1 \times v}(\underline{E})^T \lambda(l_i)$ is equal to zero and since the same is true of the diagonal entries of the diagonal matrix $diag(\underline{X}^* \underline{E})$, then none of the entries of $\eta \triangleq diag(\underline{X}^* \underline{E}) V_{1+1 \times v}(\underline{E})^T \lambda(l_i)$ is equal to zero. Equation (8) may be rewritten as $$\begin{bmatrix} 1 & 1 & \cdots & 1 & 1 \\ X_1 & X_2 & \cdots & X_v & \beta \\ \vdots & & & \vdots & \vdots \\ X_1^{t-1} & X_2^{t-1} & \cdots & X_v^{t-1} & \beta^{t-1} \end{bmatrix} \begin{bmatrix} \eta \\ \alpha \end{bmatrix} = 0 \qquad (9)$$

Assume that $\beta \notin \{X_1, \ldots, X_v\}$. The vectors in the columns of the matrix above are linearly independent since the matrix dimensions are $t \times (v+1)$, $v+1 \le t$, and the second row entries are distinct. Under these conditions it is impossible to satisfy (9) and thus assume that $\beta = X_j$ for some $j \in \{1, \ldots, v\}$. Let $U_j$ be the $v \times 1$ vector with j th entry equal to 1 and every other entry equal to zero. Omitting from (9) the bottom t-vrows results in $$\begin{bmatrix} 1 & \cdots & 1 & \cdots & 1(23) \\ X_1 & \cdots & X_j & \cdots & X_v(24) \\ \vdots & \cdots & & \cdots & \vdots(25) \\ X_1^{v-1} & \cdots & X_j^{v-1} & \cdots & X_v^{v-1} \end{bmatrix} (\eta + \alpha U_j) = 0 \qquad (10)$$

From the fact that every entry of $\eta$ is nonzero and $v \ge 2$, it is known that the vector $\eta + \alpha U_j$ is guaranteed to be a nonzero vector. Furthermore, the matrix in the left is the $v \times v$ Vandermonde matrix with second row elements $X_1, \ldots, X_v$ and thus it is nonsingular and the product cannot be zero. This is a contradiction; and therefore, the initial assumption in (8) cannot be true and the lemma is proved.

[Proof of Lemma 3.] Let $i^*$ be the index of the column with the largest number of errors (if both columns have one error, chose any one arbitrarily). If column $i^*$ has t−1 errors or less, then by Lemma 1 necessarily the rank of Mt is at least 2. If the column $i^*$ has t errors, then by Lemma 1 the rank of $M^t$ is at least t−1 and from the assumption that $t \ge 3$, the rank of $M^t$ is at least 2. Thus by letting (r, S) be the signature it is known that r is false; this is a key reason for the assumption that $t \ge 3$. Thus $$M_E^t = V_{t \times v}(\underline{X}) diag(\underline{X}^* \underline{E}) V_{t+1 \times v}(\underline{X})^T$$

It is assumed without any loss of generality that $X_1^{v-1}$ denotes the locations of the errors in the $i^*$ column, with $X_v$ denoting the location of the isolated error. Note that there exists a $\gamma \neq 0$ such that $$V_{\nu \times t+1}(\underline{X})^T \lambda(l_{i*}) = [0 \ldots 0\gamma]^T$$

$$0 \neq M_E^T \lambda(l_{i*}) = \gamma E_\nu [X_\nu X_\nu^2 \ldots X_\nu^t]^T$$

which together with the finding that r is false, implies that the syndrome signature of this case is in not in the pass set.

[Proof of Lemma 4.] Suppose that there exists $i \in \{1, \ldots, |\Pi|\}$ such that $M_E^T \lambda(i) = 0$ and recall that $M_E^T = V_{t \times t}(\underline{X}) \text{diag}(\underline{X}^* E) V_{t+1 \times t}(\underline{X})^T$. The first two matrices in this product representation of $\overline{M}_E^t$ have full rank and therefore it must be true that $V_{t+1 \times t}(\underline{X})^T \lambda(l_i) = 0$. But this implies that $1/X_1, \ldots, 1/X_t$ are the t zeros of the polynomial with coefficients $\lambda(l_i)$. By definition, this polynomial has zeros confined to a single column which leads to a contradiction.

Deferred halting for improved error rates. The purpose of this section is to show how to adapt Algorithm 1 to a setting in which columns are N times longer (for a total length of t×N symbols), by using independent applications of the same code but decoding them jointly. A block is identified with the t×|Π| array to which one instance of the code is applied; stacking N blocks vertically leads to the setting under consideration. An algorithm is presently that has significantly improved undesired halting rates. A key idea used herein is the notion of deferred halting, in which the earlier stages of the decoding are allowed to output decoded data with the convention that the halt signal may be deferred until at the time of finishing the decoding of the last data block. This algorithm can then be used both in a form in which all of the output of the decoder is buffered and an uncorrectable error signal is generated at the end of the processing of the blocks, or in a form in which decoded blocks are released as they are processed with the convention that a halt signal may be raised after the block has been released.

In this section, signatures can belong to either of three categories: pass, conditional pass, and unequivocal halt. The choice of names reflects the fact that the definition of the pass set is identical to the previous one. On the other hand, the halt set will be split in two sets.

A signature is said to belong to the unequivocal halt set if and only if there is no unique column of the signature equal to the all zeros column vector. A signature is said to belong to the conditional pass set if it is neither in the pass set nor in the unequivocal halt set. Specifically, a signature in the conditional pass set has exactly one of its columns equal to the all zeros vector and at least one of its columns can be written as $$\alpha[1 \beta \ldots \beta^{t-1}]^T$$

for some $0 \neq \alpha \in GF(q)$ and $\beta \in \Gamma$.

Algorithms 2 and 3. Two algorithms are utilized and labeled as Algorithm 2 and 3. An innovation is found in Algorithm 3, which consists of repeated applications of Algorithm 2, which in turn is a modified version of Algorithm 1. As before, is it assumed that at most t+1 errors have occurred and that only one column has more than one error. It is also assumed that columns are numbered $1, 2, \ldots, |\Gamma|$. Recall that whenever a block has a signature that is in the pass set or in the conditional pass set, one (and only one) column of the signature S is exactly equal to the all zeros vector. The index of this column is called the target column of the block; the label tarcol is used in the algorithm below to refer to it.

Algorithm 2. Modified version of Algorithm 1, to be used in conjunction with Algorithm 3.
1. Initialize pass=errors=tarcol=0. Receive data to be decoded and compute the syndromes. If the syndromes are all equal to zero, go to step 4.
2. Compute the signature (r, S) of the syndromes. If the signature is in the
    (a) unequivocal halt set, then halt.
    (b) conditional pass set, then go to 3.
    (c) pass set, then raise flag pass to 1 and then go to 3.
3. (Error Correction Step) Set tarcol to be the index of the unique all-zeros column of S. If the flag pass is equal to
    1: Then it is known that the number of errors is the range [1, t]; correct them using a standard decoding algorithm and set errors to be the number of errors.
    0: There could be t errors or t+1 errors. Assume that there are exactly t errors all confined to tarcol, set errors=t and correct them using a standard algorithm to compute the error magnitudes.
4. End of the algorithm.

Algorithm 2 is then used as a building block in Algorithm 3.

Algorithm 3 is a decoding algorithm for N blocks.
1. Set gpass=gerrors=gtarcol=0.
2. for i=1, ..., N
3. Apply Algorithm 2 to block i; system will halt if the algorithm halts.
4. The variables pass, errors and tarcol are returned by Algorithm 2. If errors>0
    a. Increment gerrors by errors.
    b. If gtarcol=0 then gtarcol=tarcol.
    c. If pass=1, then let gpass=1.
    d. If gtarcol≠tarcol then halt.
5. next i.
6. If gerrors>0 and gpass=0 then halt.
7. End of the algorithm.

Theorem 2. Algorithm 3 corrects any error pattern confined to a single column if no more than t−1 errors affect any given block within the column. This algorithm will halt on all error events affecting one column and at least one additional symbol in error outside the column with the requirement that no two of the additional symbols in error are located in the same block. If the errors are confined to a single column then this algorithm will either correct them or halt on a fraction that does not exceed $$\frac{[(q-1)t|\Pi|(|\Pi|-1)]^N}{q^{N \times t} - 1}$$

of the total number of such errors.

Proof of Theorem 2.

Algorithm 3 corrects any errors affecting up to t−1 symbols confined to a single column.: Since not more than t−1 errors affect any one given block, we have that $(r_i, S_i)$ is in the pass set for any $1 \leq i \leq N$ and that Algorithm 2 corrects them. Also, the target column is identical for any block that has at least one error. Thus it is clear that the halt option in Step 4d is never invoked. In Step 6 the halt option is also not invoked because the signature of any block with errors is in the pass set. Thus the algorithm corrects all errors and never halts.

Algorithm 3 will halt on all error events affecting one column and at least one additional symbol in error outside the column with the requirement that no two of the additional symbols in error are located in the same block. It is assumed throughout the proof that the set of signatures associated with the set of blocks does not contain a signature in the unequivocal halt set, for otherwise the algorithm will trivially halt during the execution of step 3 for some iteration of the loop. Thus every block either has no errors (and hence no signature) or has a signature in the pass or conditional pass sets and consequently a target column. If there are two blocks with signature with different target columns, then the algorithm will halt in Step 4d.

Thus the behavior of the algorithm only needs to be examined when every block with a signature has a target column that is common to all such blocks; let j* be the index of the common target column. Let $\Phi$ be set of indices of the blocks with signature (since there is at least one error, $\Phi \neq \emptyset$), $\Phi_P \subset \Phi$ be the subset of indices of blocks with signature in the pass set and $\Phi_{cp} = \Phi \setminus \Phi_P$ be the subset of indices of blocks with signature is in the conditional pass set.

If $|\Phi_P|=0$ then the flag gpass is never raised in Step 4c and the algorithm halts in Step 6. Assume that $|\Phi_P|>0$. If $|\Phi_{cp}|=0$ (and hence $\Phi_P=\Phi$) then all of the errors are confined to a unique common column which contradicts the assumption on the error pattern. Thus, assume simultaneously $|\Phi_{cp}|>0$ and $|\Phi_P|>0$. The target column of those blocks in $\Phi_P$ is equal to j* whereas the signature of a block in $\Phi_{cp}$ has its j* th column equal to $$\alpha[1 \beta \ldots \beta^{t-1}]^T$$

with $0 \neq \alpha \in GF(q)$ and $\beta \in \Gamma$ (this can be seen from the proof of Lemma 3). Thus it is impossible for any of the target column of the blocks in $\Phi_{cp}$ to be equal to j*, contradicting the assumption of a common target column. This observation leads to the conclusion that Algorithm 3 will eventually halt in step 4d.

Analysis of the number of correctable errors turned uncorrectable by Algorithm 3. Assume that an error is confined within one column. Thus clearly those blocks with errors will have a signature that is either in the pass set or the conditional pass set, and moreover, all of the target columns of the blocks are identical and equal to the index of the column to which the errors are confined. As a consequence, the only way to halt when this type of error takes place is in step 6, where a halt is caused if all of the blocks had a signature in the conditional pass set. It is known that if a block has t−1 errors or less, then its signature must be in the pass set. Therefore, for a halt to occur on an error pattern confined to a column, all of the blocks must have exactly t errors confined to a common column. Let i* be that common column. Counting the number of choices that exist for the error pattern in any given block; from the proof of Theorem 1 it can be seen that this number is at most $$(q-1)t|\Pi|(|\Pi|-1)$$

and since the same code is applied independently to each of the N blocks, results in that the number of error patterns confined to a single column that will cause a halt for Algorithm 3 is at most $$[(q-1)t|\Pi|(|\Pi|-1)]^N$$

Noting that there is a total of $q^{N \times t}-1$ error patterns confined to a single column of length N×t results in Theorem 2.

End of Description of Exemplary Supporting Algorithms.

Exemplary embodiments include a computing system with a processor(s) and an I/O unit(s) (e.g., requesters) interconnected to a memory system that contains a memory controller and memory devices. In exemplary embodiments, the memory system includes a processor or memory controller interfaced to a set of hub devices (also referred to as "hub chips"). The hub devices connect and interface to the memory devices. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g., a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

Figure 1:
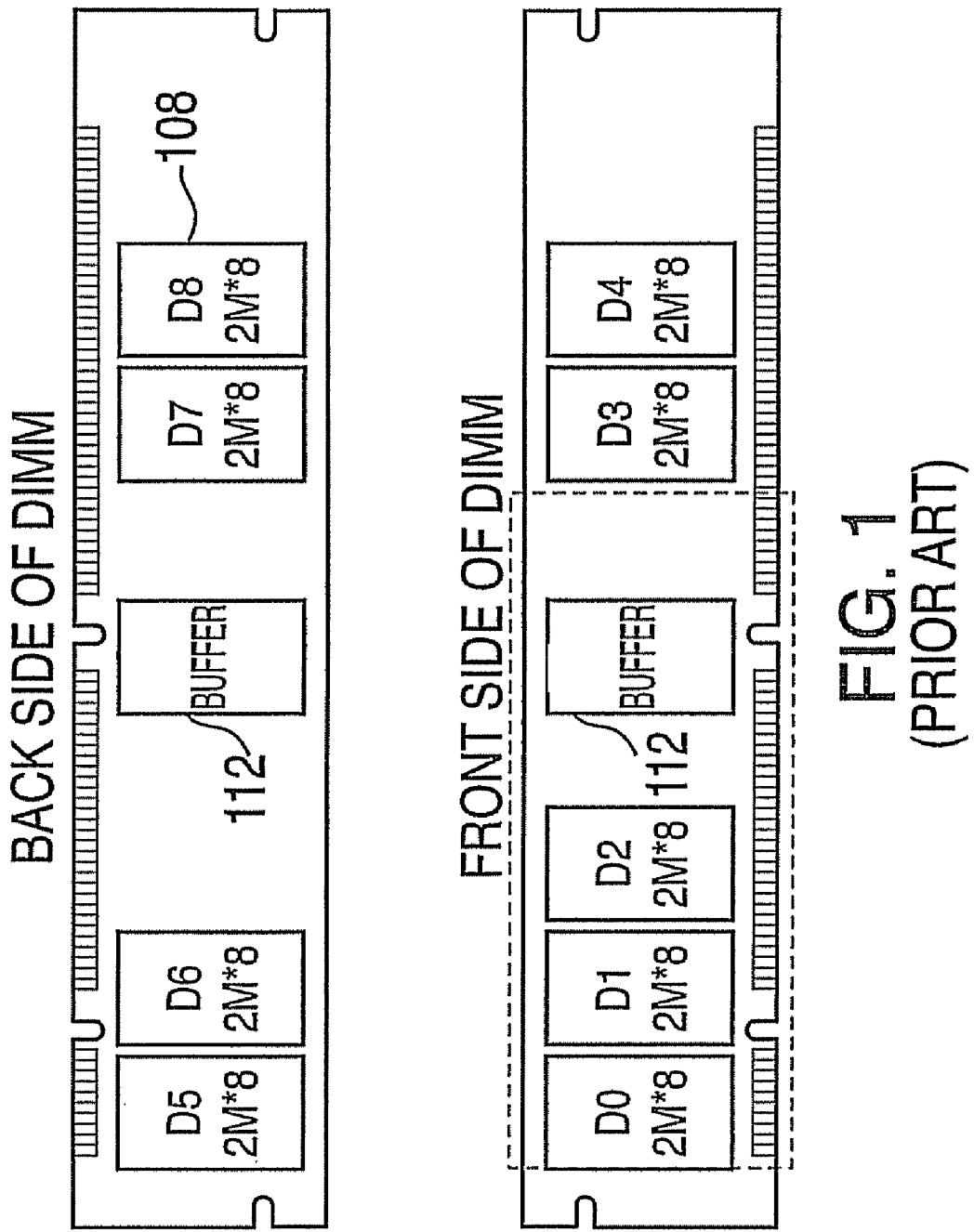
FIG. 1 depicts an exemplary early synchronous memory module.
Figure 2:
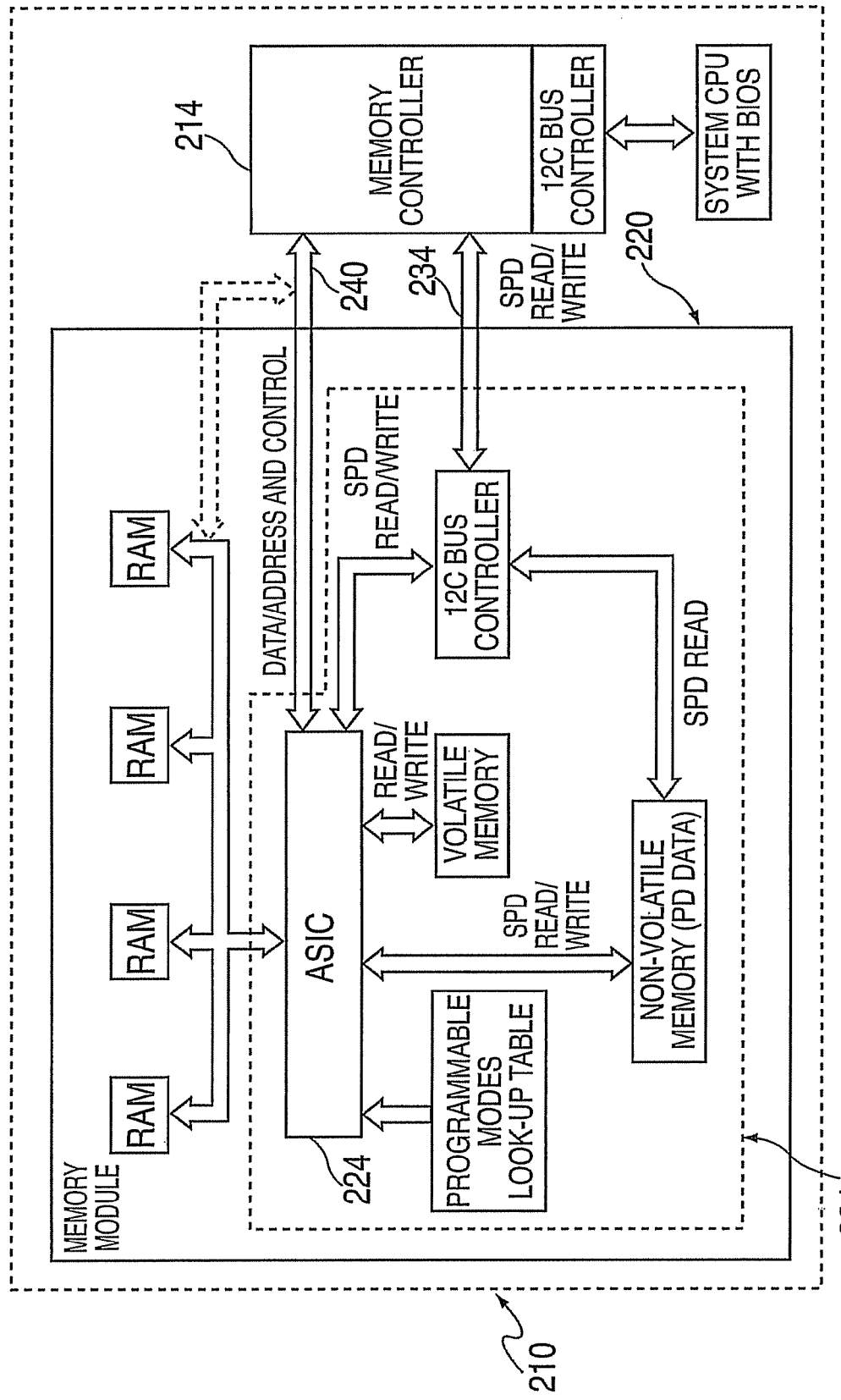
FIG. 2 depicts an exemplary computer system with a fully buffered synchronous memory module that is directly connected to a memory controller.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. The DIMM depicted in FIG. 1 includes 168 pins in the exemplary embodiment, whereas subsequent DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g., packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits of exemplary embodiments include the ability to perform more robust error detection than would be possible using only the standard ECC processing. As described herein, an ECC code may be supplemented with a syndrome trapper to provide an increased level of data integrity. The syndrome trapper may be utilized to provide an affordable solution while still providing data integrity. In addition, the use of the syndrome trapper may help to minimize memory system downtime by reducing the number of mis-corrected and undetected errors.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A method for performing error detection in a computer system, the method comprising:
   calculating one or more signatures associated with data that contains an error;
   determining if the error is a potential correctable error; and
   when the error is a potential correctable error, then:
      comparing the calculated signatures to one or more signatures in a trapping set, the trapping set including signatures associated with uncorrectable errors; and
      setting an uncorrectable error flag in response to determining that at least one of the calculated signatures is equal to a signature in the trapping set.

2. The method of claim 1 further comprising:
   receiving the data;
   generating check bits associated with the data; and
   computing one or more syndromes in response to the check bits and the data, wherein the signatures are calculated from the syndromes, and the data contains an error if one or more of the syndromes is non-zero.

3. The method of claim 1 wherein the error is a potential correctable error if exactly one of the signatures associated with the data is equal to zero.

4. The method of claim 1 wherein the data is received from one or more memory devices in a memory system.

5. The method of claim 4 wherein at least one of the uncorrectable errors indicates a memory device failure together with a random error on an other memory device.

6. The method of claim 1 wherein the computer system is a memory system and the data is received from one or more memory modules.

7. The method of claim 1 further comprising receiving the data from one or more of a volatile storage device and a non-volatile storage device.

8. The method of claim 1 further comprising receiving the data via one or more busses.

9. The method of claim 1 further comprising halting operation of the system in response to setting the uncorrectable error flag.

10. The method of claim 1 wherein a Reed-Solomon code is utilized to determine if the data contains an error.

11. The method of claim 1 wherein the uncorrectable errors include one additional error beyond the number of errors correctable by an error control code utilized to determine if the data contains an error.

12. A memory system for performing error detection, the memory system comprising:
   a single memory module or a plurality of memory modules operating in unison in response to memory read requests, each memory module including one or more memory devices; and
   a processor including logic for facilitating:
      calculating one or more signatures associated with data returned in response to a memory read request that contains an error;
      determining if the error is a potential correctable error; and
      when the error is a potential correctable error, then:
         comparing the calculated signatures to one or more signatures in a trapping set, the trapping set including signatures associated with uncorrectable errors; and
         setting an uncorrectable error flag in response to determining that at least one of the calculated signatures is equal to a signature in the trapping set.

13. The memory system of claim 12 wherein the processor is located in a memory controller that generates the memory read requests.

14. The memory system of claim 12 wherein a minimum burst length of the memory devices is eight.

15. The memory system of claim 12 wherein the error in the data is detected using a Reed-Solomon code.

16. The memory system of claim 12 wherein two of the memory modules operate in unison, each of the two memory modules having nine memory devices and providing eight bytes of data on each of two bursts to supply the data to a 128 byte cache line.

17. A system for performing error detection, the system comprising:
- error code correction logic for determining if data contains an error; and
- syndrome trapping logic for performing a method in response to the data containing an error, the method including:
    - calculating one or more signatures for the data;
    - determining if the error is a potential correctable error; and
    - when the error is a potential correctable error, then:
        - comparing the calculated signatures to one or more signatures in a trapping set, the trapping set including signatures associated with uncorrectable errors; and
        - setting an uncorrectable error flag in response to determining that at least one of the calculated signatures is equal to a signature in the trapping set.

18. The system of claim 17 wherein the determining performed by the error code correction logic includes:
- receiving the data;
- generating check bits associated with the data; and
- computing one or more syndromes in response to the check bits and the data, wherein the signatures are calculated from the syndromes, wherein the data contains an error if one or more of the syndromes is non-zero.

19. The system of claim 17 wherein the syndrome trapping logic is located on a hub device in a memory system.

* * * * *